US012787409B2

(12) United States Patent
Lee et al.

(10) Patent No.: US 12,787,409 B2
(45) Date of Patent: Nov. 3, 2026

(54) SEMICONDUCTOR DEVICE HAVING TWO-DIMENSIONALLY ACTIVE REGIONS SEPARATED BY DEVICE ISOLATIONS INCLUDING WORD LINES AND BIT LINES

(71) Applicant: SAMSUNG ELECTRONICS CO., LTD., Suwon-si (KR)

(72) Inventors: Kiseok Lee, Suwon-si (KR); Keunnam Kim, Suwon-si (KR); Hui-Jung Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 357 days.

(21) Appl. No.: 18/507,224

(22) Filed: Nov. 13, 2023

(65) Prior Publication Data

US 2024/0266408 A1 Aug. 8, 2024

(30) Foreign Application Priority Data

Feb. 3, 2023 (KR) ........................ 10-2023-0014688

(51) Int. Cl.

*H10D 64/23* (2025.01)
*H10B 12/00* (2023.01)
*H10B 61/00* (2023.01)
*H10B 63/00* (2023.01)
(Continued)

(52) U.S. Cl.

CPC ........... *H10D 64/252* (2025.01); *H10D 84/83* (2025.01)

(58) Field of Classification Search

CPC .. H10D 64/252; H10D 84/83; H10B 12/0335; H10B 12/053; H10B 12/488; H10B 12/34; H10B 12/315; H10B 12/30; H10B 12/482; H10B 12/485; H10B 61/22; H10B 63/10; H10B 63/30

See application file for complete search history.

(56) References Cited

U.S. PATENT DOCUMENTS 8,674,420 B2 3/2014 Yeom
10,043,810 B1 8/2018 Ikeda
(Continued)

FOREIGN PATENT DOCUMENTS

KR 10-2009-0010486 A 1/2009
KR 10-2009-0025402 A 3/2009
(Continued)

*Primary Examiner* — Herve-Louis Y Assouman

(74) *Attorney, Agent, or Firm* — Fish & Richardson P.C.

(57) ABSTRACT

A semiconductor device includes a device isolation part on a substrate and defining active regions that are two-dimensionally disposed in first and second directions, the active regions each extending in the first direction; first and second word lines crossing the active regions in the second direction and adjacent to each other in the first direction; a first impurity region in the active region between the first and second word lines; a second impurity region in the active region at one side of the first word line and spaced apart from the first impurity region; a first conductive pad in contact with the first impurity region; a second conductive pad in contact with the second impurity region; a bit line on the first conductive pad and extending in the first direction; a storage node contact structure on the second conductive pad; and a landing pad on the storage node contact structure.

20 Claims, 46 Drawing Sheets

(51) Int. Cl.
*H10B 63/10* (2023.01)
*H10D 84/83* (2025.01)

(56) References Cited

U.S. PATENT DOCUMENTS

| | | | | |
|---|---|---|---|---|
| 2010/0176486 | A1* | 7/2010 | Miyajima | H10D 89/10<br>257/532 |
| 2017/0076974 | A1* | 3/2017 | Choi | H01L 21/7682 |
| 2019/0164975 | A1* | 5/2019 | Song | H10B 12/30 |
| 2019/0206877 | A1* | 7/2019 | Kim | G11C 8/14 |
| 2022/0384449 | A1 | 12/2022 | Kim et al. | |

FOREIGN PATENT DOCUMENTS

| | | | |
|---|---|---|---|
| KR | 10-2015-0027363 | A | 3/2015 |
| KR | 10-2022-0162019 | A | 12/2022 |

* cited by examiner

SEMICONDUCTOR DEVICE HAVING TWO-DIMENSIONALLY ACTIVE REGIONS SEPARATED BY DEVICE ISOLATIONS INCLUDING WORD LINES AND BIT LINES

CROSS-REFERENCE TO RELATED APPLICATIONS

This U.S. non-provisional patent application claims priority under 35 U.S.C. § 119 to Korean Patent Application No. 10-2023-0014688, filed on Feb. 3, 2023, in the Korean Intellectual Property Office, the entire contents of which are hereby incorporated by reference.

BACKGROUND

1. Field

Embodiments relate to a semiconductor device.

2. Description of the Related Art

Due to their small-sized, multifunctional, or low-cost characteristics, semiconductor devices may be used in the electronic industry. Semiconductor devices have been highly integrated with the development of the electronic industry. Critical dimensions of patterns of the semiconductor devices have been more and more reduced for higher integration of the semiconductor devices.

SUMMARY

The embodiments may be realized by providing a semiconductor device including a substrate; a device isolation part on the substrate and defining active regions that are two-dimensionally disposed in a first direction and a second direction, the active regions each extending in the first direction; first and second word lines crossing the active regions in the second direction and adjacent to each other in the first direction; a first impurity region in an active region between the first and second word lines; a second impurity region in an active region at one side of the first word line and spaced apart from the first impurity region; at least one first conductive pad in contact with the first impurity region; at least one second conductive pad in contact with the second impurity region; a bit line on the at least one first conductive pad and extending in the first direction; at least one storage node contact structure on the at least one second conductive pad; and a landing pad on the at least one storage node contact structure.

The embodiments may be realized by providing a semiconductor device including a substrate; a device isolation part on the substrate and defining active regions that are two-dimensionally disposed in a first direction and a second direction, the active regions each extending in the first direction; first and second word lines crossing the active regions in the second direction and adjacent to each other in the first direction; a first impurity region in an active region between the first and second word lines; a second impurity region in an active region at one side of the first word line and spaced apart from the first impurity region; at least one first conductive pad in contact with the first impurity region; at least one second conductive pad in contact with the second impurity region; a bit line on the at least one first conductive pad and extending in the first direction; and a storage node contact structure on the at least one second conductive pad, wherein one of the active regions includes a first sidewall and a second sidewall that are opposite to each other, extend in the first direction, and are parallel to each other, the bit line, the at least one first conductive pad, and the at least one second conductive pad overlap the first sidewall and are spaced apart from the second sidewall, when viewed in a plan view, and the storage node contact structure overlaps the second sidewall and is spaced apart from the first sidewall when viewed in a plan view.

The embodiments may be realized by providing a semiconductor device including a substrate; a device isolation part on the substrate and defining active regions that are two-dimensionally disposed in a first direction and a second direction, the active regions each extending in the first direction; first and second word lines crossing the active regions in the second direction and adjacent to each other in the first direction; a word line capping pattern on each of the first and second word lines and buried in the substrate; a gate insulating layer between the first word line and the substrate; a first impurity region in an active region between the first and second word lines; a second impurity region in an active region at one side of the first word line and spaced apart from the first impurity region; a first conductive pad in contact with the first impurity region; a second conductive pad in contact with the second impurity region; a bit line on the first conductive pad and extending in the first direction; a storage node contact structure on the second conductive pad; a landing pad on the storage node contact structure; and a first bit line spacer and a second bit line spacer sequentially between the bit line and the storage node contact structure, wherein the active regions include a first active region and a second active region adjacent to each other in the second direction, and wherein a first distance between a first impurity region in the first active region and a second impurity region in the second active region is greater than a second distance between the first impurity region in the first active region and a first impurity region in the second active region.

BRIEF DESCRIPTION OF THE DRAWINGS

Features will be apparent to those of skill in the art by describing in detail exemplary embodiments with reference to the attached drawings in which:

FIGS. 3A to 11A and 12 are plan views of stages in a method of manufacturing the semiconductor device of FIG. 1A.

FIGS. 3B to 11B are cross-sectional views of stages in a method of manufacturing the semiconductor device of FIG. 1B.

FIGS. 3C to 11C are cross-sectional views of stages in a method of manufacturing the semiconductor device of FIG. 1C.

FIGS. 3D to 8D are cross-sectional views of stages in a method of manufacturing the semiconductor device of FIG. 1D.

DETAILED DESCRIPTION

Figure 1A:
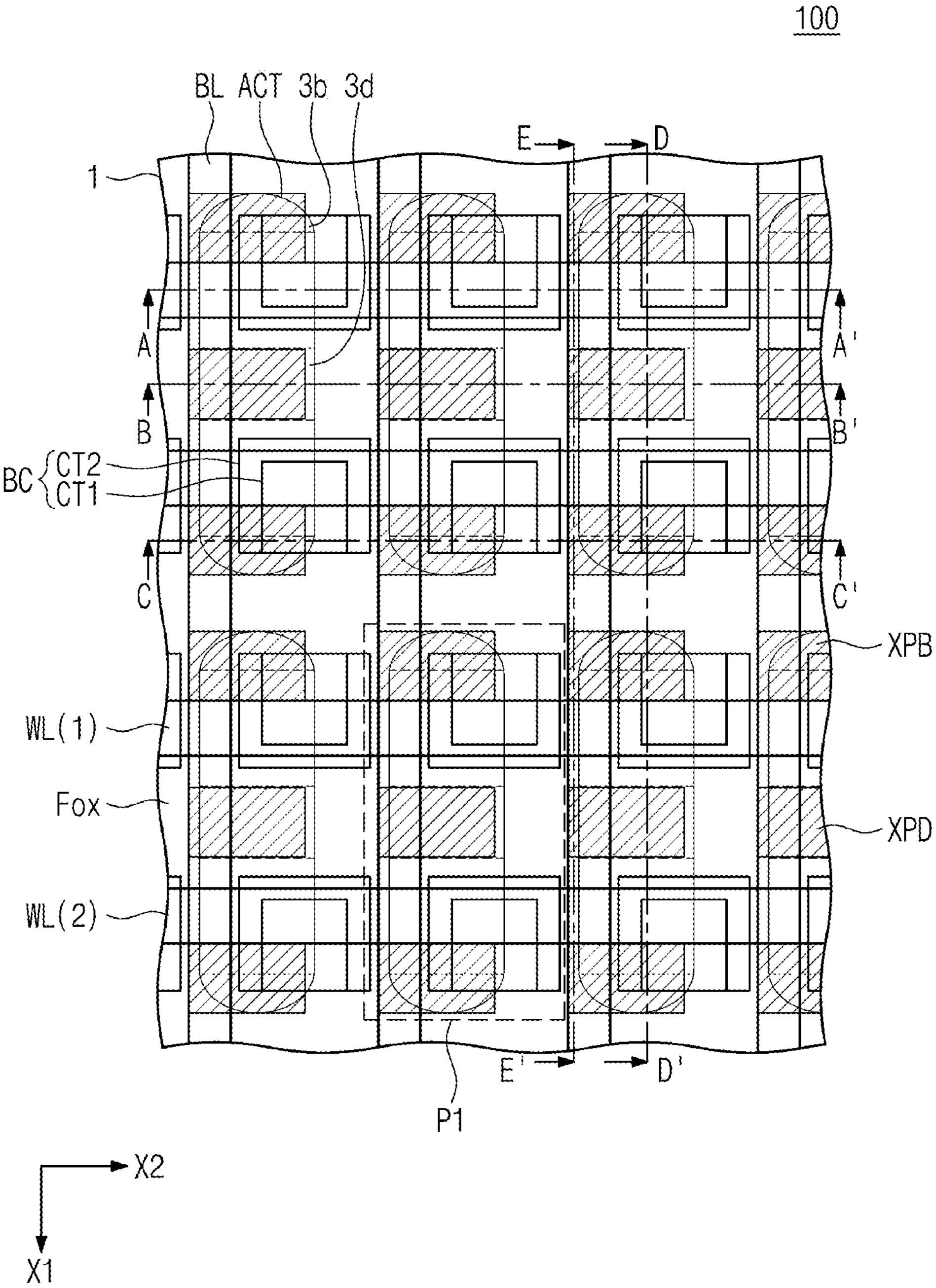
FIG. 1A is a plan view of a semiconductor device according to embodiments of the present disclosure.
Figure 1B:
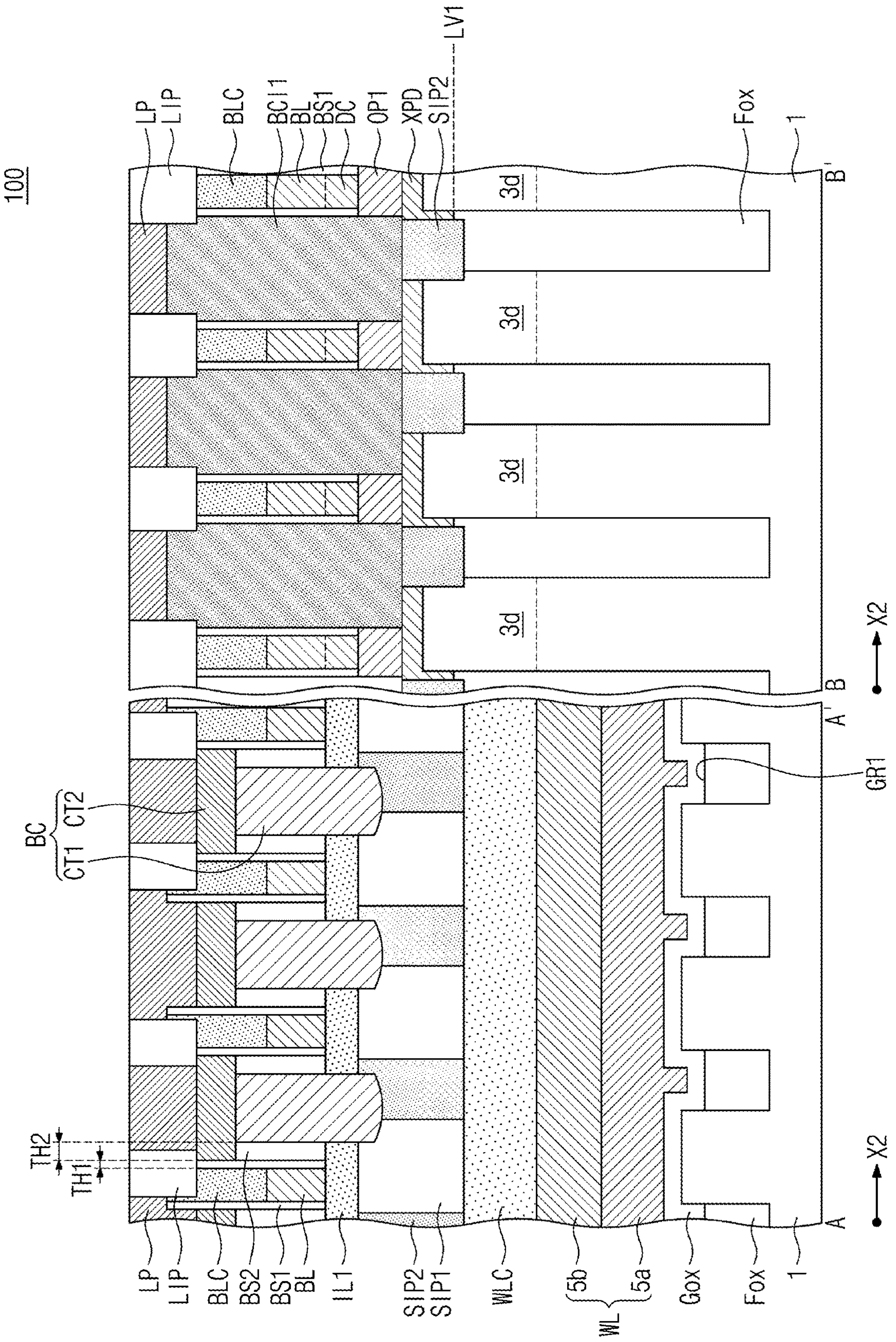
FIG. 1B is cross-sectional views of FIG. 1A taken along line A-A' and line B-B' according to embodiments of the present disclosure.
Figure 1C:
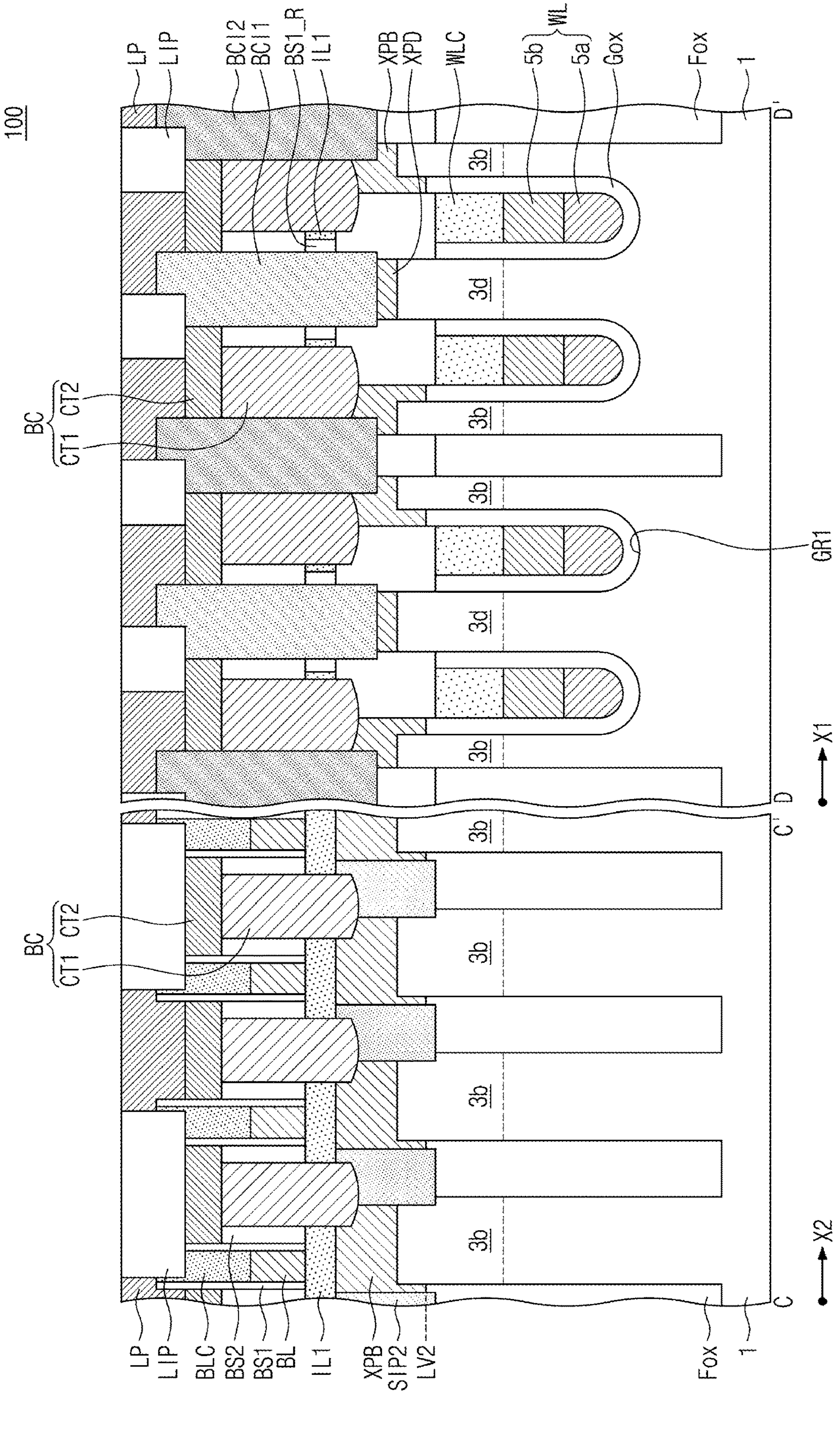
FIG. 1C is cross-sectional views of FIG. 1A taken along lines C-C' and lines D-D' according to embodiments of the present disclosure.
Figure 1D:
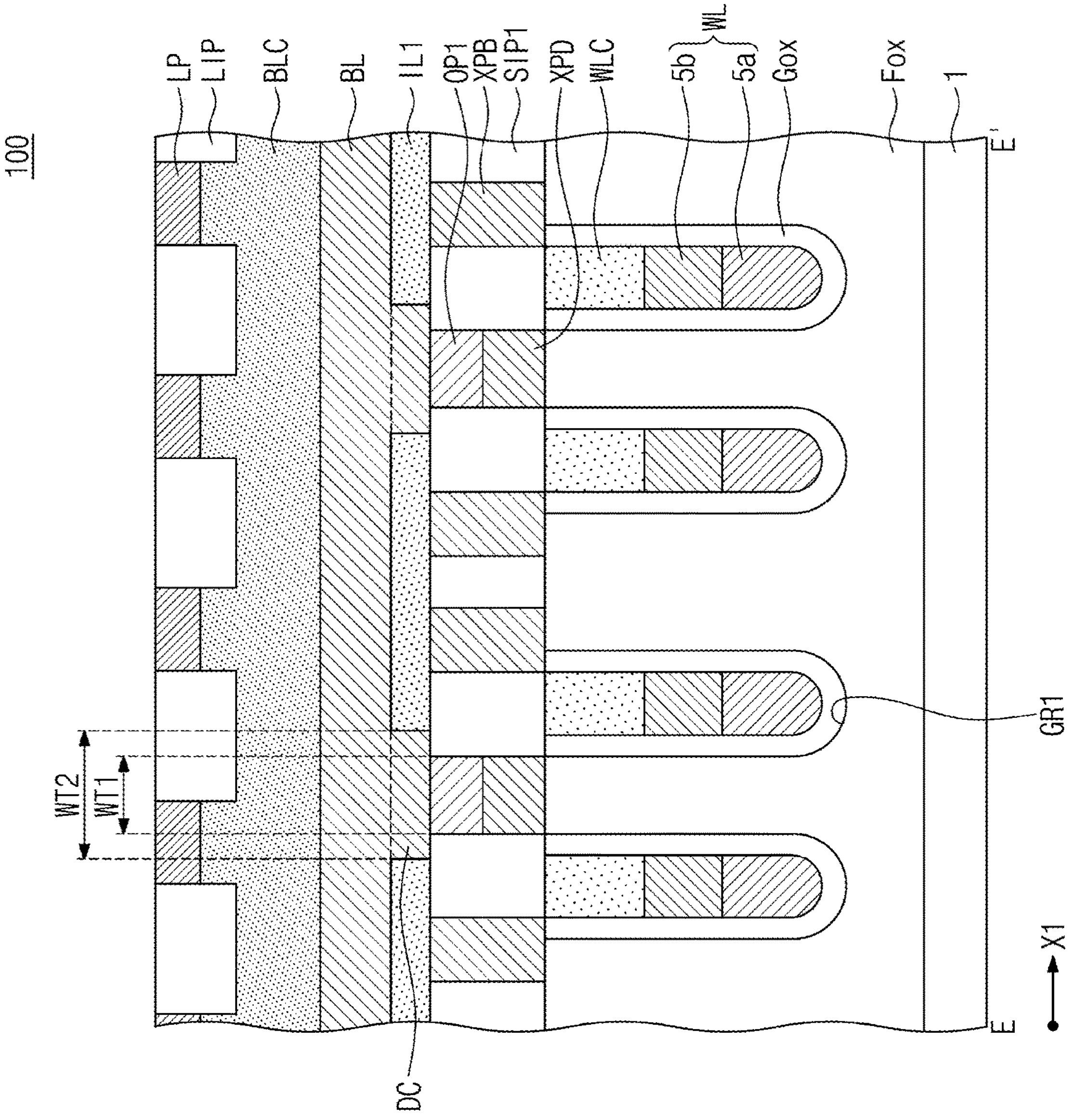
FIG. 1D is a cross-sectional view of FIG. 1A taken along line E-E' according to embodiments of the present disclosure.
Figure 2:
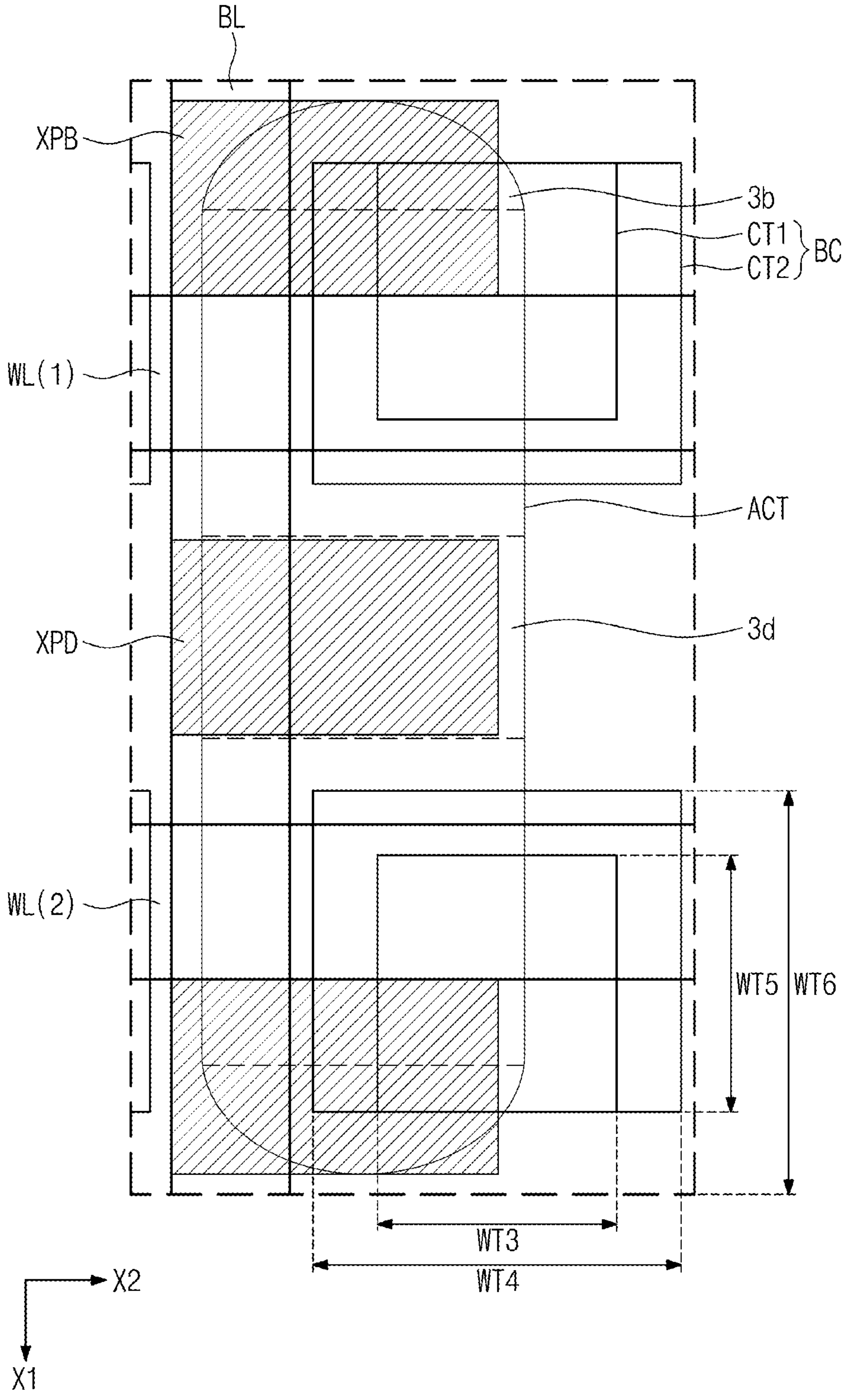
FIG. 2 is an enlarged view of portion 'P1' of FIG. 1A.

FIG. 1A is a plan view of a semiconductor device according to embodiments of the present disclosure. FIG. 1B is cross-sectional views of FIG. 1A taken along line A-A' and line B-B' according to embodiments of the present disclosure. FIG. 1C is cross-sectional views of FIG. 1A taken along lines C-C' and lines D-D' according to embodiments of the present disclosure. FIG. 1D is a cross-sectional view of FIG. 1A taken along line E-E' according to embodiments of the present disclosure. FIG. 2 is an enlarged view of portion 'P1' of FIG. 1A.

Referring to FIGS. 1A to 1D and 2, in a semiconductor device 100 according to the present embodiment, device isolation parts Fox may be on a substrate 1 to define active regions ACT. The substrate 1 may include a semiconductor material. Each of the device isolation parts Fox may include a single layer or multilayer structure of, e.g., silicon oxide, silicon oxynitride, or silicon nitride. As used herein, the term "or" is not necessarily an exclusive term, e.g., "A or B" would include A, B, or A and B. An upper surface of the device isolation part Fox may be lower than the upper surface of the substrate 1, and an upper sidewall of the substrate 1 may be exposed. The semiconductor device 100 may be a semiconductor memory device.

Figure 3A:
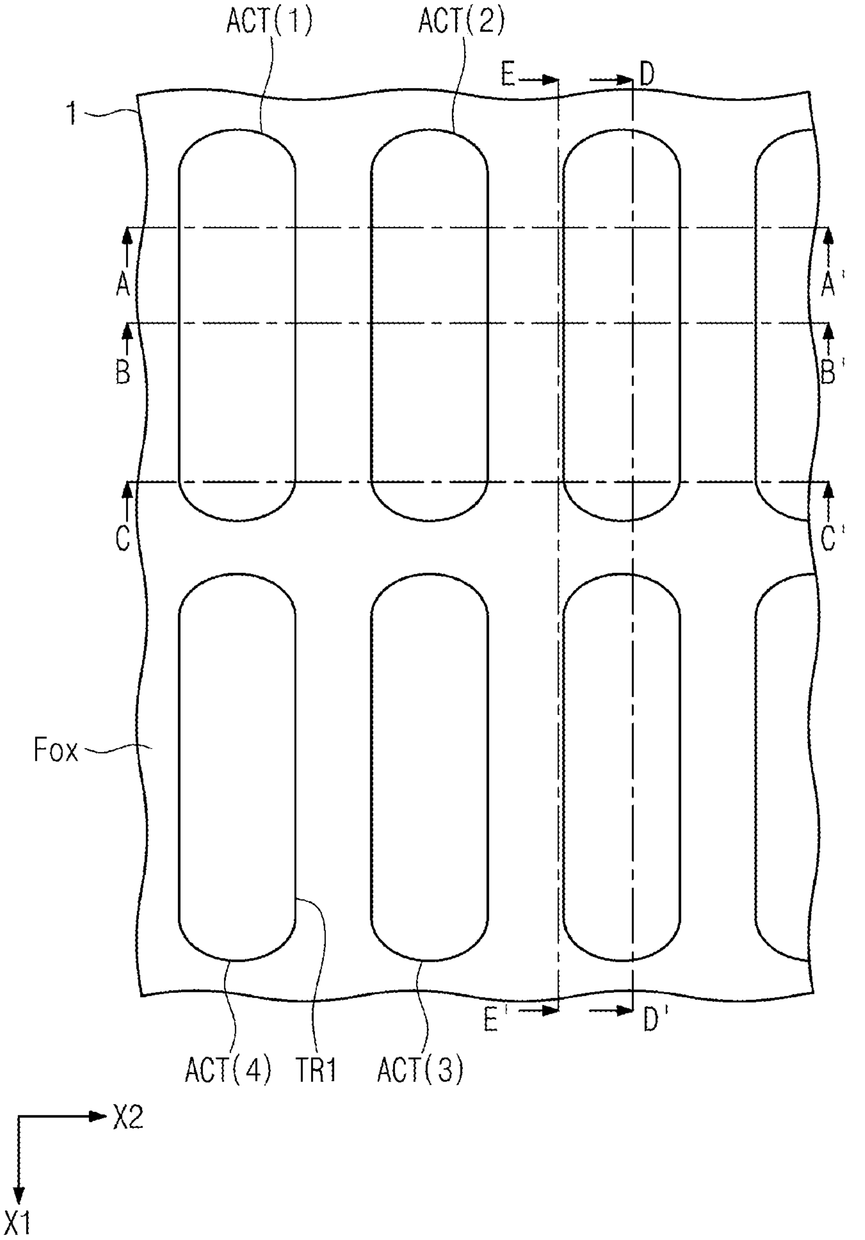
Figure 3B:
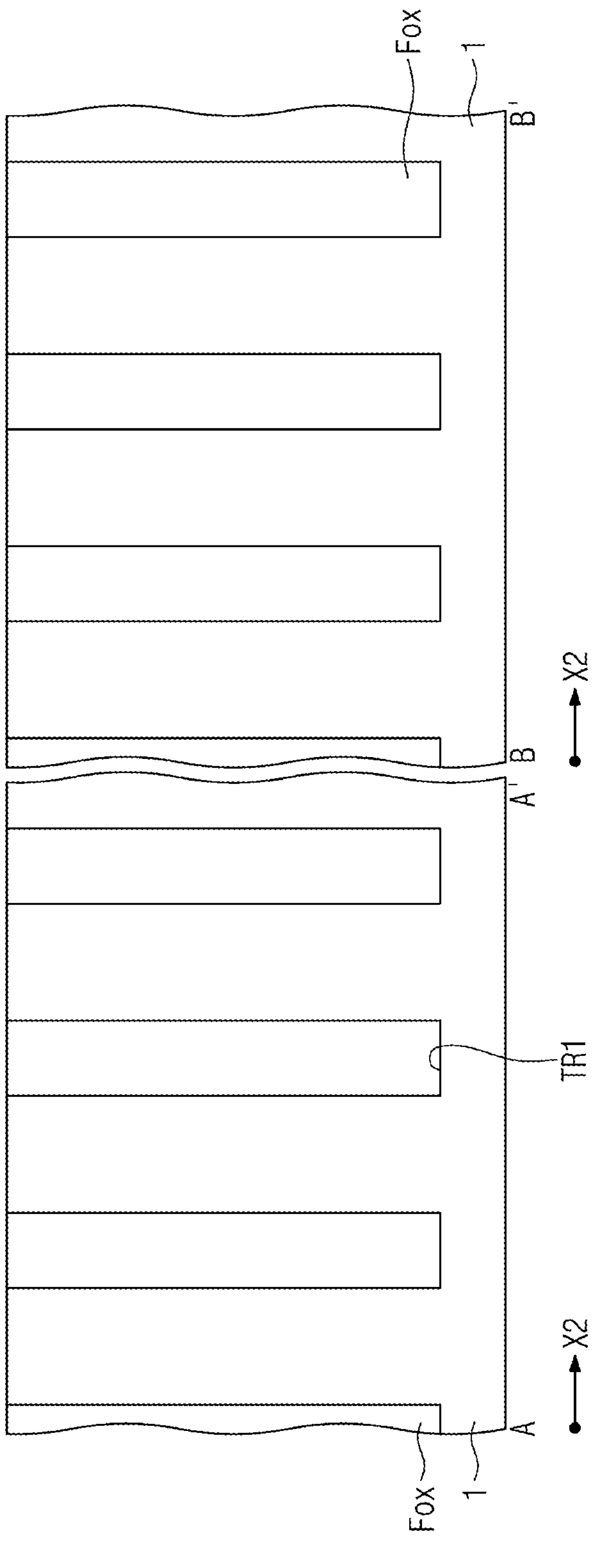
Figure 3C:
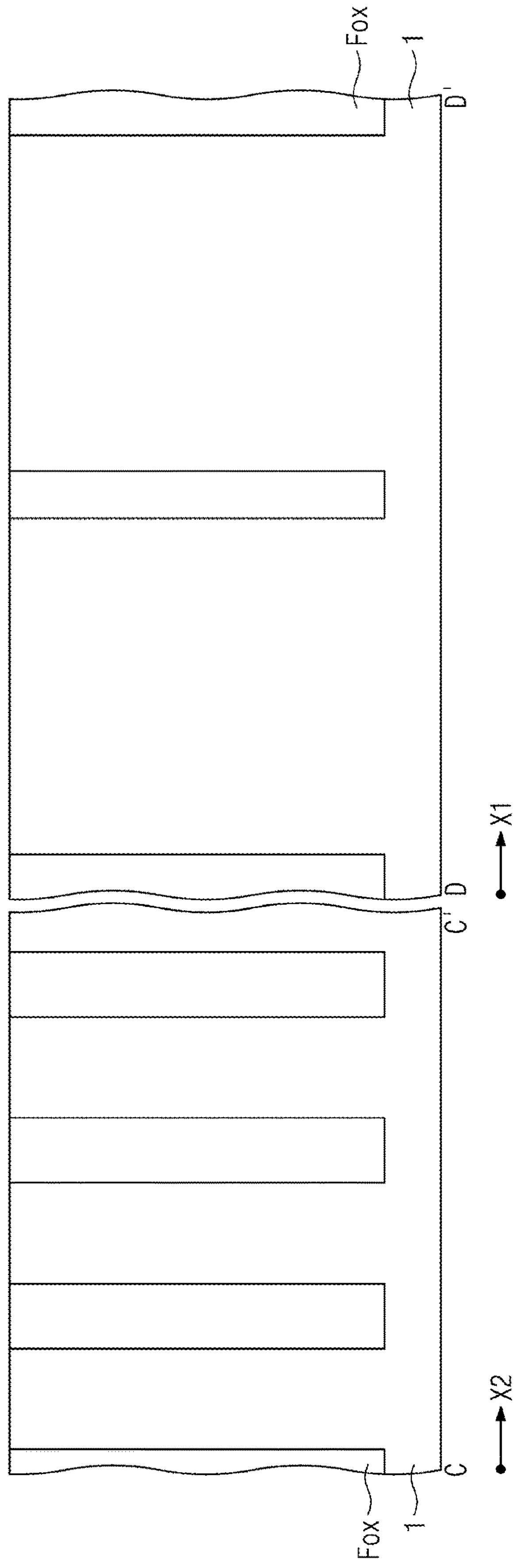
Figure 3D:
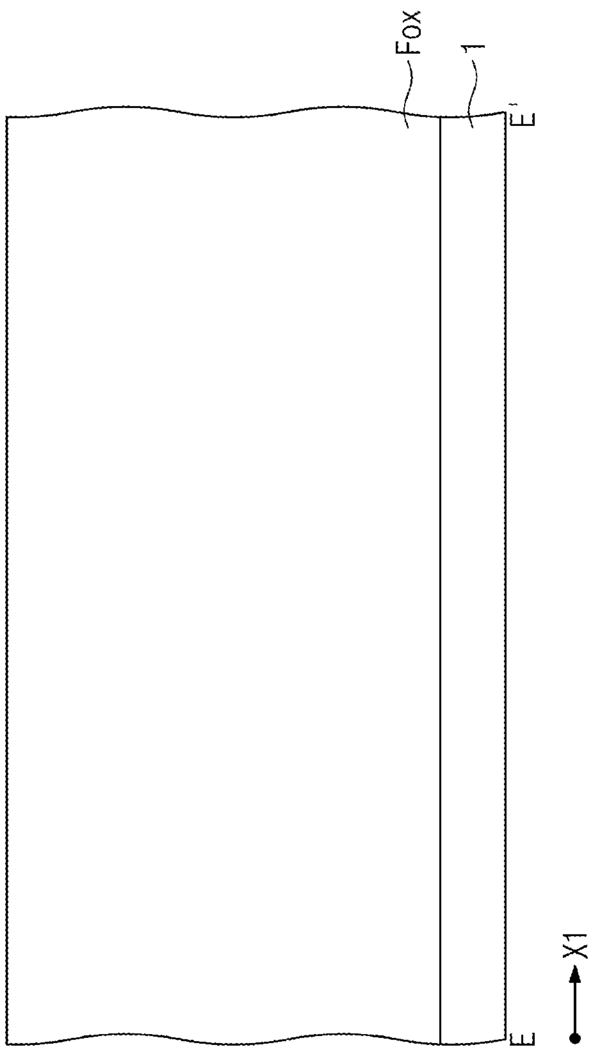

Each of the active regions ACT may have an isolated shape. When viewed in a plan view, the active regions ACT may respectively correspond to portions of the substrate 1 surrounded by the device isolation part Fox. The active regions ACT may be two-dimensionally arranged in a first direction X1 and a second direction X2 crossing the first direction X1. Each of the active regions ACT may have a bar shape that is elongate or extends in the first direction X1 in a plan view. Referring to FIG. 3A, the active regions ACT may include first to fourth active regions ACT(1) to ACT(4) sequentially arranged in a clockwise direction. The first and second active regions ACT(1) and ACT(2) may be spaced apart from each other in the second direction X2. The fourth and third active regions ACT(4) and ACT(3) may be spaced apart from each other in the second direction X2. The first and second active regions ACT(1) and ACT(2) may be spaced apart from the fourth and third active regions ACT(4) and ACT(3) in the first direction X1.

When viewed in a plan view, ends of the active regions ACT may be rounded. In an implementation, referring to FIG. 2, the active regions ACT may have first sidewalls SW1 and second sidewalls SW2 that extend in the first direction X1 and are opposite to each other. The active regions ACT may further include a third sidewall SW3 connecting ends of the first sidewall SW1 and the second sidewall SW2, and the third sidewall SW3 may be rounded.

Word lines WL may cross the active regions ACT in the second direction X2. The word lines WL may be in grooves GR1 in the device isolation part Fox and the active regions ACT. The word lines WL may be spaced apart from each other in the first direction X1.

Each of the word lines WL may include a first word line pattern 5*a* and a second word line pattern 5*b* sequentially deposited. Each of the first word line pattern 5*a* and the second word line pattern 5*b* may include a conductive material.

The first word line pattern 5*a* may be formed of a first conductive material. The second word line pattern 5*b* may be formed of a second conductive material. A second work function of the second conductive material may be greater than a first work function of the first conductive material. When the word line WL is turned off due to a difference in work function, an electric field around the second word line pattern 5*b* adjacent to first and second impurity regions 3*d* and 3*b* may be reduced. As a result, leakage current may be reduced during OFF operation. In an implementation, when the word line WL is turned on due to the difference in work function, inversion around the second word line pattern 5*b* may be improved, thereby increasing ON current. Accordingly, ON/OFF controllability of the word line WL may be improved. The first work function may be, e.g., 4.2 eV or less, and the second work function may be, e.g., 4.4 eV or more. The first conductive material may include, e.g., TiN, Mo, W, Cu, Al, TaN, Ru, or Ir. The second conductive material may include, e.g., polysilicon or silicon germanium doped with an impurity (e.g., phosphorus or boron).

A gate insulating layer Gox may be between each of the word lines WL and the substrate 1 and between the word lines WL and the device isolation part Fox. In an implementation, bottoms of the grooves GR1 may be relatively deep in the device isolation part Fox and relatively shallow in the active regions ACT. Lower surfaces of the word lines WL may be curved. The gate insulating layer Gox may include, e.g., a thermal oxide, silicon nitride, silicon oxynitride, or a high dielectric material. In an implementation, the gate insulating layer Gox may include, e.g., a thermal oxide.

The word lines WL may include first and second word lines WL(1) and WL(2) adjacent to each other. A first impurity region 3*d* may be in each of the active regions ACT between the first and second word lines WL(1) and WL(2), and a pair of second impurity regions 3*b* may be respectively in both edge regions of each of the active regions ACT. The first and second impurity regions 3*d* and 3*b* may be doped with, e.g., N-type impurities. The first impurity region 3*d* may correspond to a common drain region and the second impurity regions 3*b* may correspond to a source region. One of the word lines WL and the first and second impurity regions 3*d* and 3*b* adjacent thereto may constitute one transistor. The word lines WL may be in the grooves GR1, and thus a channel length of a channel region under the word lines WL may be increased in a limited plane area. Therefore, short-channel effect or the like may be minimized.

Figure 4A:
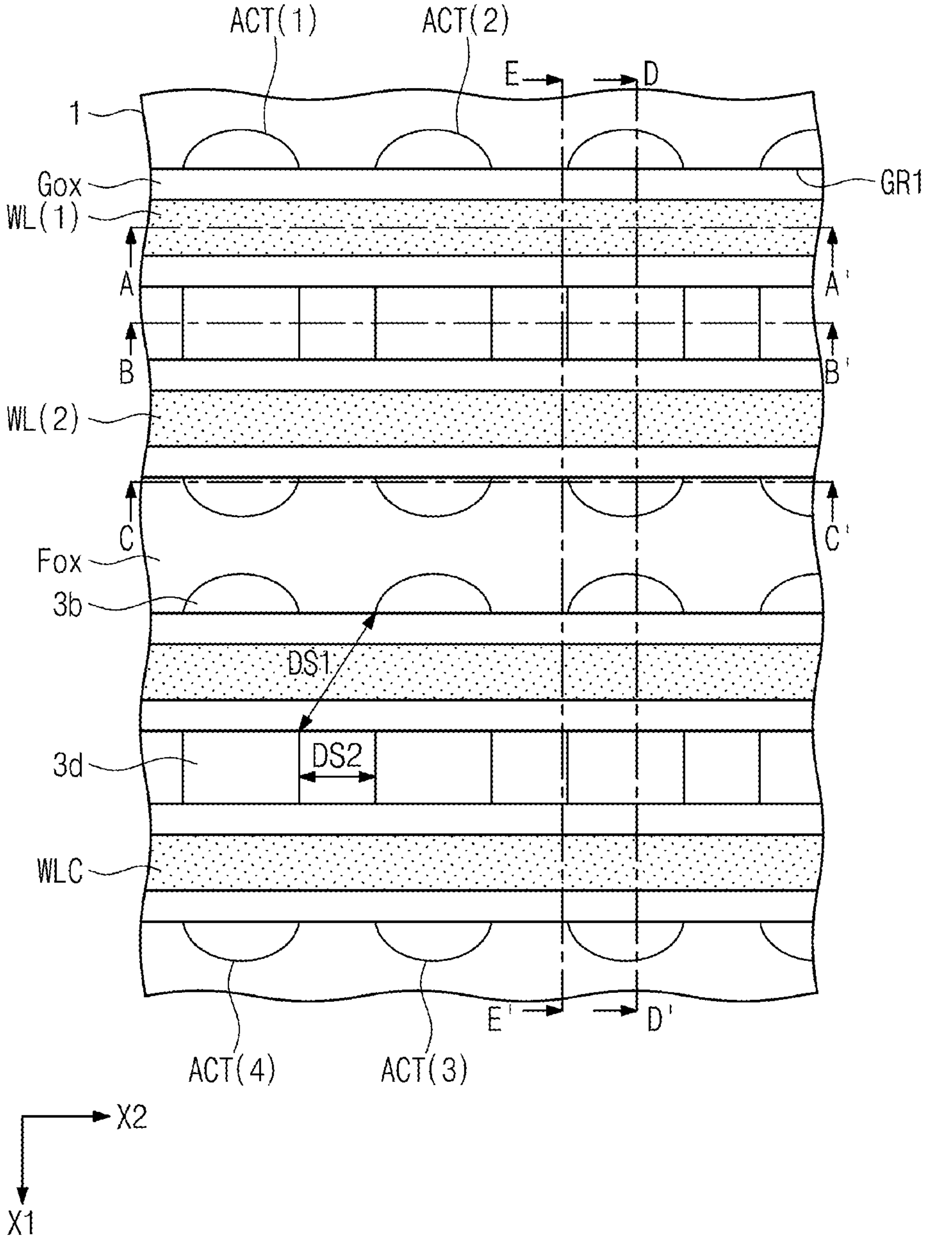
Figure 4B:
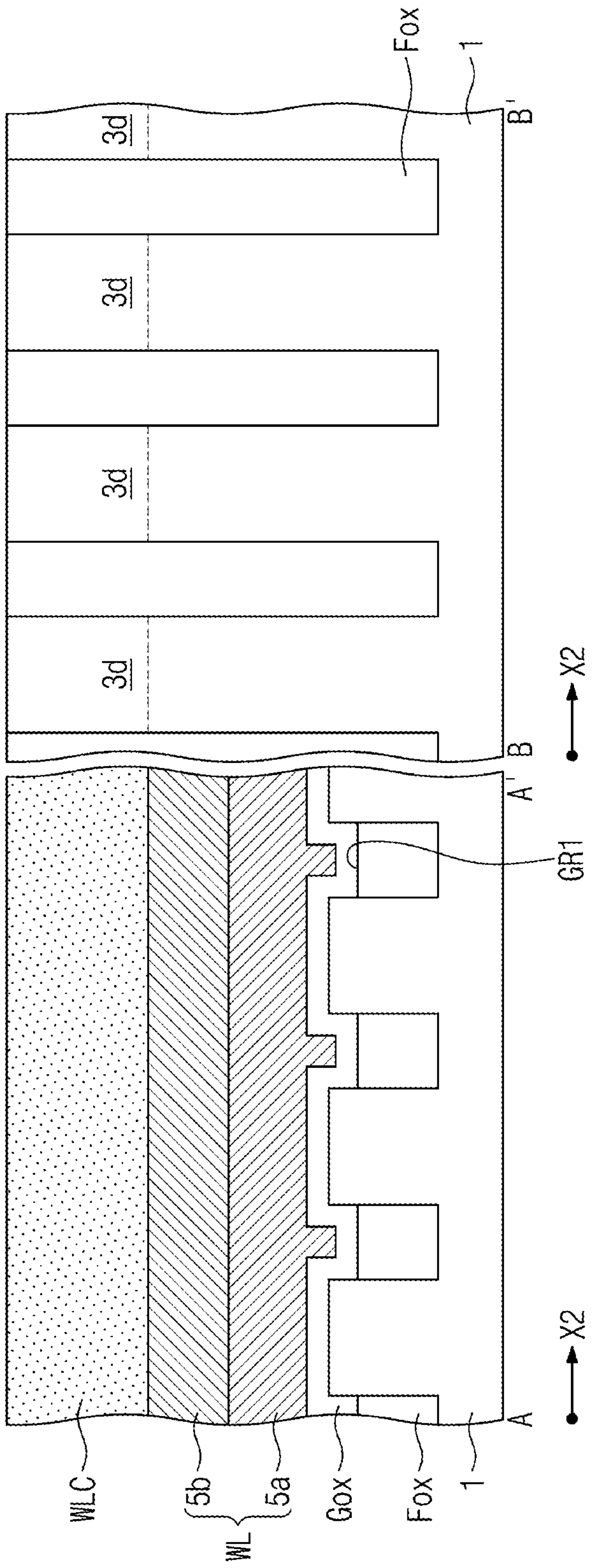
Figure 4C:
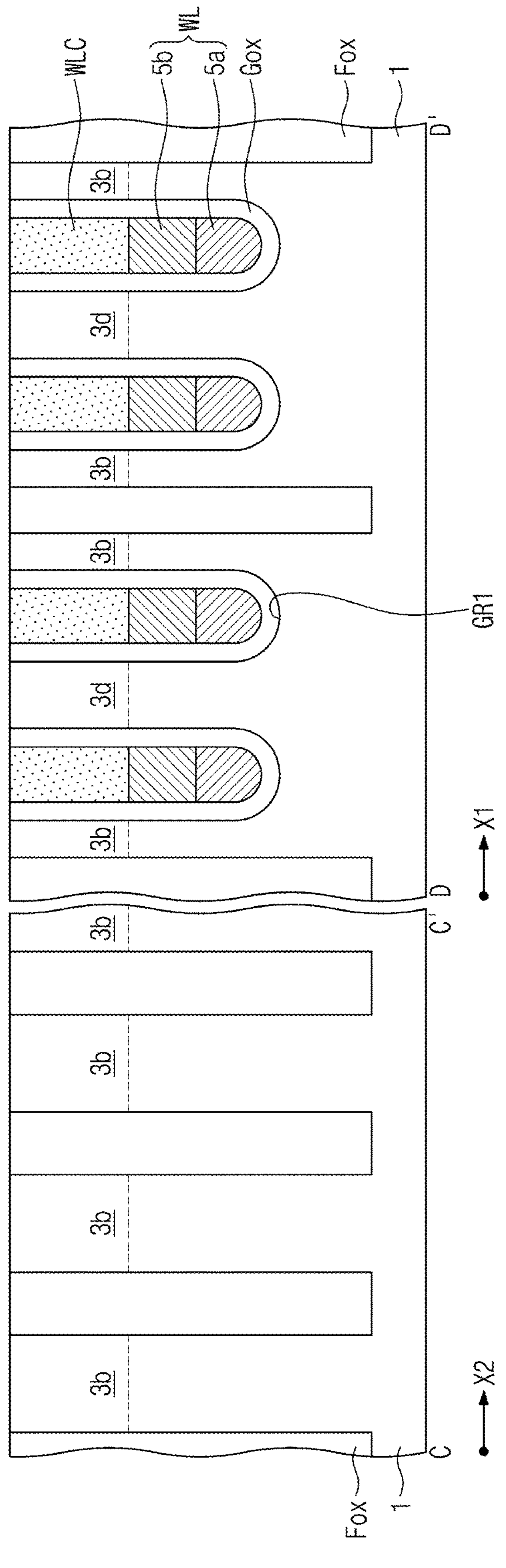
Figure 4D:
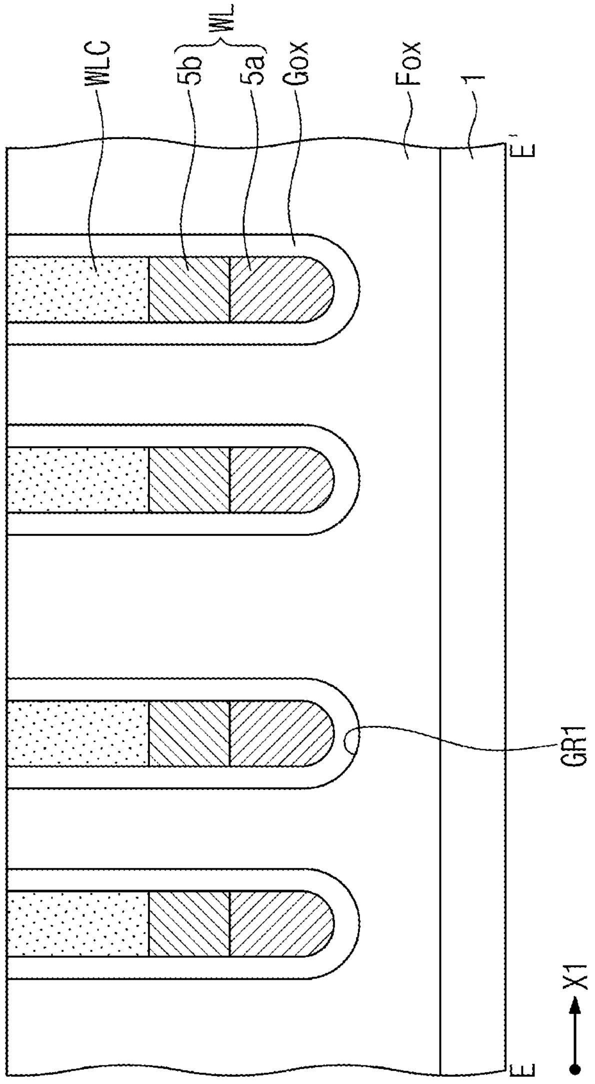
Figure 5A:
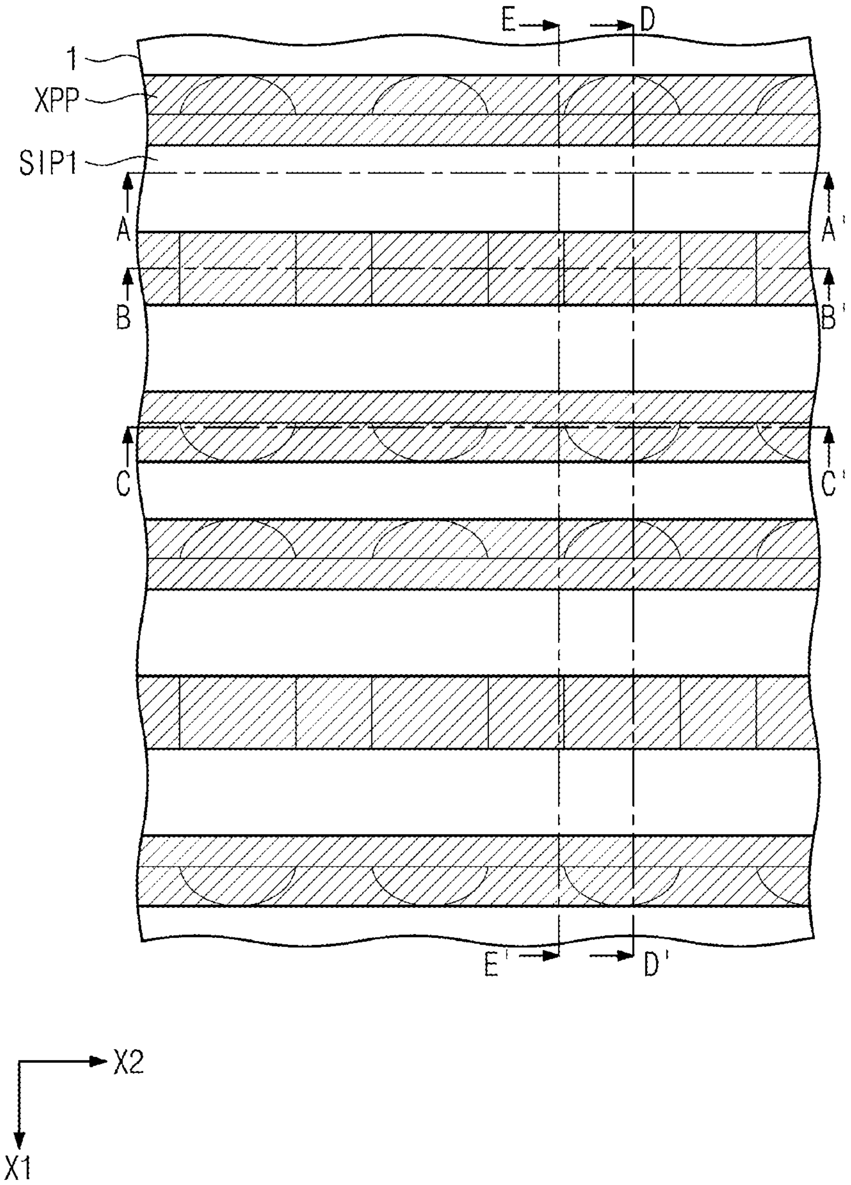
Figure 5B:
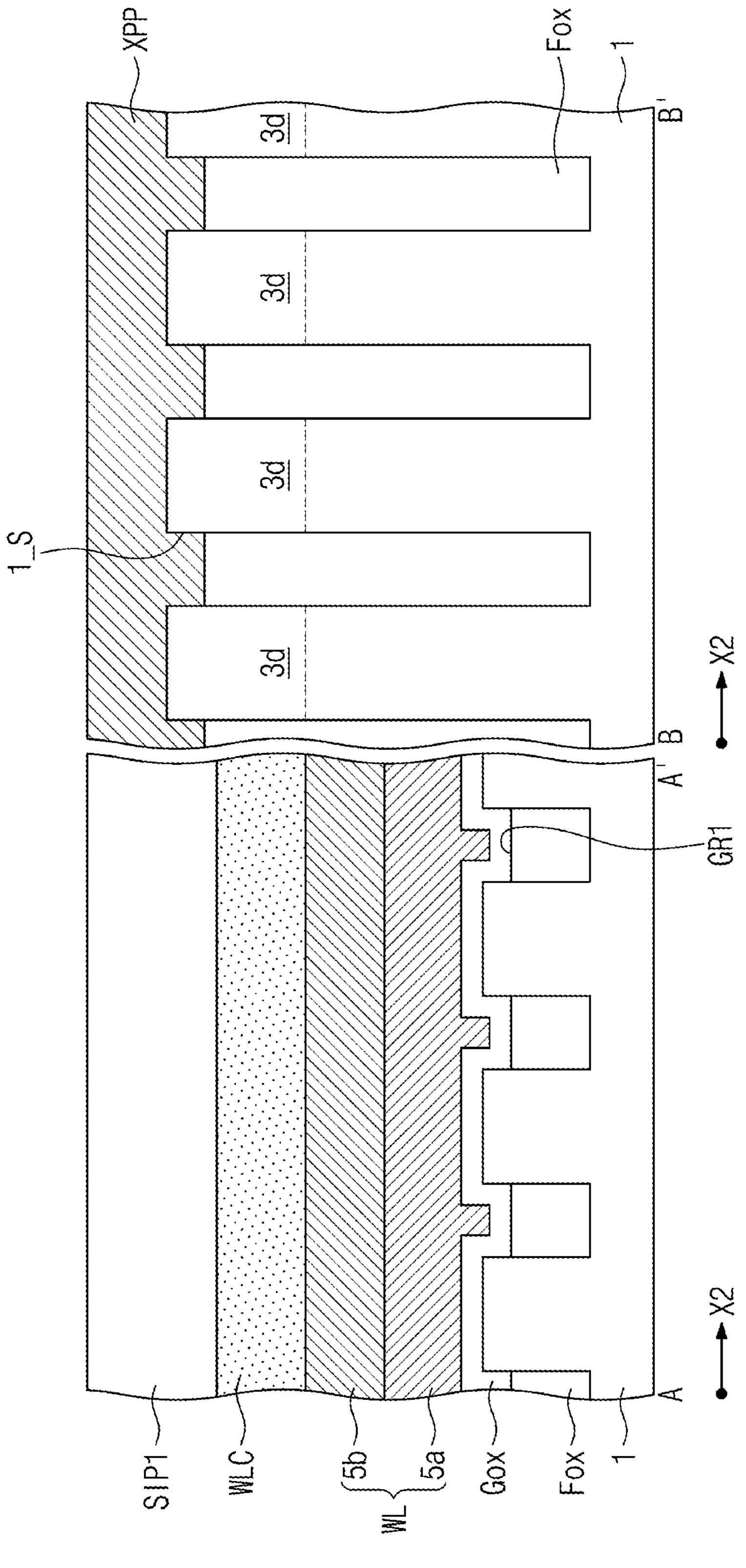
Figure 5C:
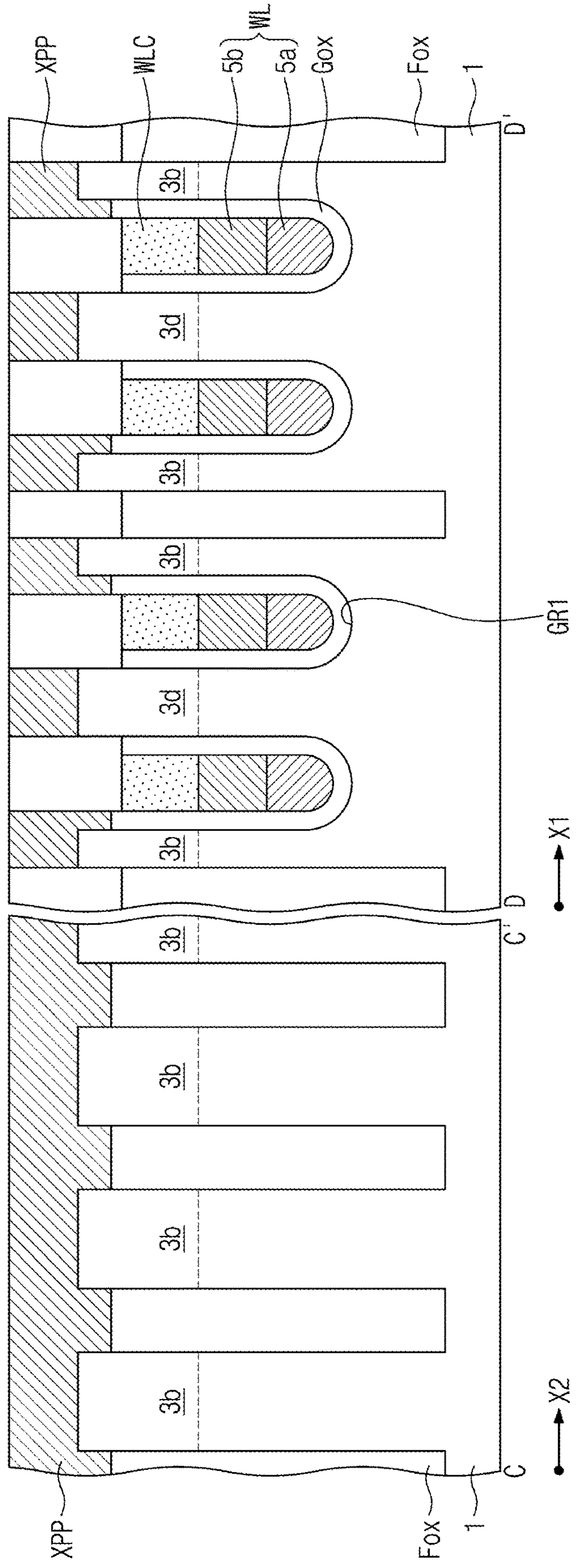
Figure 5D:
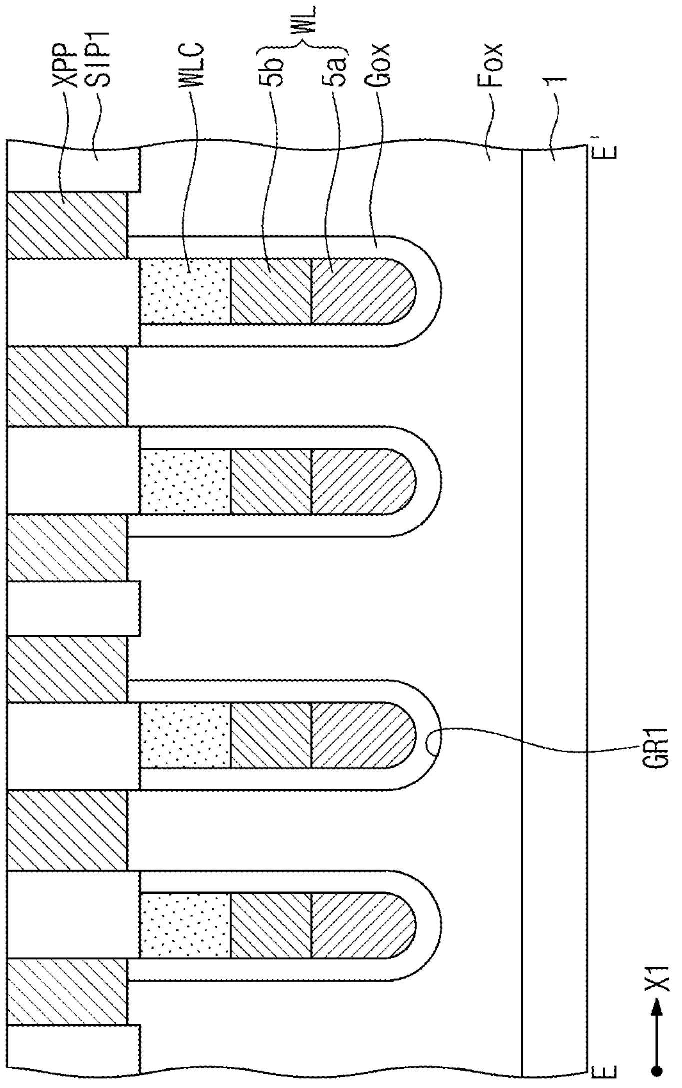

Referring to FIG. 4A, in the semiconductor device 100 according to the present disclosure, a first distance DS1 between a first impurity region 3*d* in one active region (e.g., ACT(4)) and a second impurity region 3*b* adjacent thereto and in another active region (e.g., ACT(3)) may be greater than a second distance DS2 between the first impurity regions 3*d* adjacent to each other in the second direction X2. Accordingly, a short circuit between the first impurity region 3*d* and the second impurity region 3*b* adjacent thereto may be reduced or prevented. In the semiconductor device 100 according to the present disclosure, position/arrangement of the active regions may have an increased or improved misalignment margin compared to other devices. In an implementation, when forming mask patterns for forming the active regions, process difficulty may be reduced and scalability may be maximized, thereby reducing process defects and improving reliability of a semiconductor device.

A word line capping pattern WLC may be on each of the word lines WL. The word line capping patterns WLC may have a line shape extending in the length direction of the word lines WL, and may cover entire upper surfaces of the word lines WL, respectively. The word line capping patterns WLC may fill the grooves GR1 on the word lines WL. The word line capping pattern WLC may be formed of, e.g., a silicon nitride layer. The gate insulating layer Gox may be between the word line capping pattern WLC and the substrate 1. In FIG. 1C, an upper surface of the gate insulating layer Gox may be lower than the upper surface of the substrate 1 and may expose the upper sidewall of the substrate 1.

A first conductive pad XPD may be on the first impurity region 3*d*. Second conductive pads XPB may be on the second impurity regions 3*b*, respectively. The first conductive pad XPD and the second conductive pad XPB may each include polysilicon doped with the same impurity at the same concentration. A first level LV1 of a lower end of the first conductive pad XPD in FIG. 1B may be substantially the same as a second level LV2 of a lower end of the second conductive pad XPB in FIG. 1C. The first conductive pad XPD and the second conductive pad XPB may respectively cover an upper sidewall of the substrate 1. Accordingly, a contact area between the first conductive pad XPD and the substrate 1 and a contact area between the second conductive pad XPB and the substrate 1 may increase, thereby reducing contact resistance therebetween and improving reliability of the semiconductor device.

A portion of the second conductive pad XPB may protrude outside the active region ACT to cover the device isolation part Fox. A planar area of the second conductive pad XPB may be larger than a planar area of the second impurity regions 3*b*. As a result, a misalignment margin between the second conductive pad XPB and a subsequent storage node contact structure BC may be increased. Thus, the reliability of the semiconductor device may be improved.

The second conductive pad XPB may overlap the gate insulating layer Gox. When viewed in a plan view of FIG. 2, each of the first conductive pad XPD and the second conductive pad XPB may have a rectangular shape. The first conductive pad XPD and the second conductive pad XPB may overlap the first sidewall SW1 of the active region ACT and may be spaced apart from the second sidewall SW2 of the active region ACT. A portion of the first impurity region 3*d* may be exposed without overlapping the first conductive pad XPD. A portion of the second impurity region 3*b* may be exposed without overlapping the second conductive pad XPB.

Figure 6A:
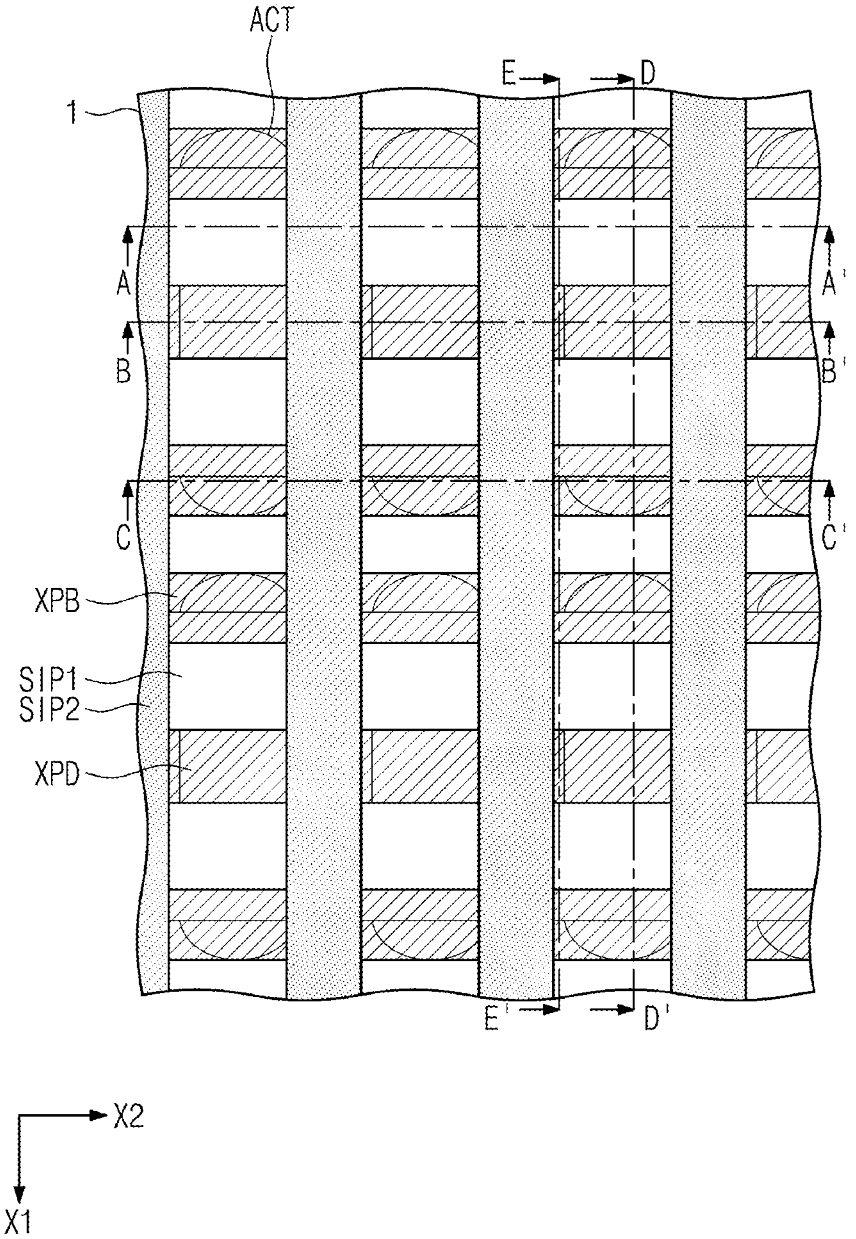
Figure 6B:
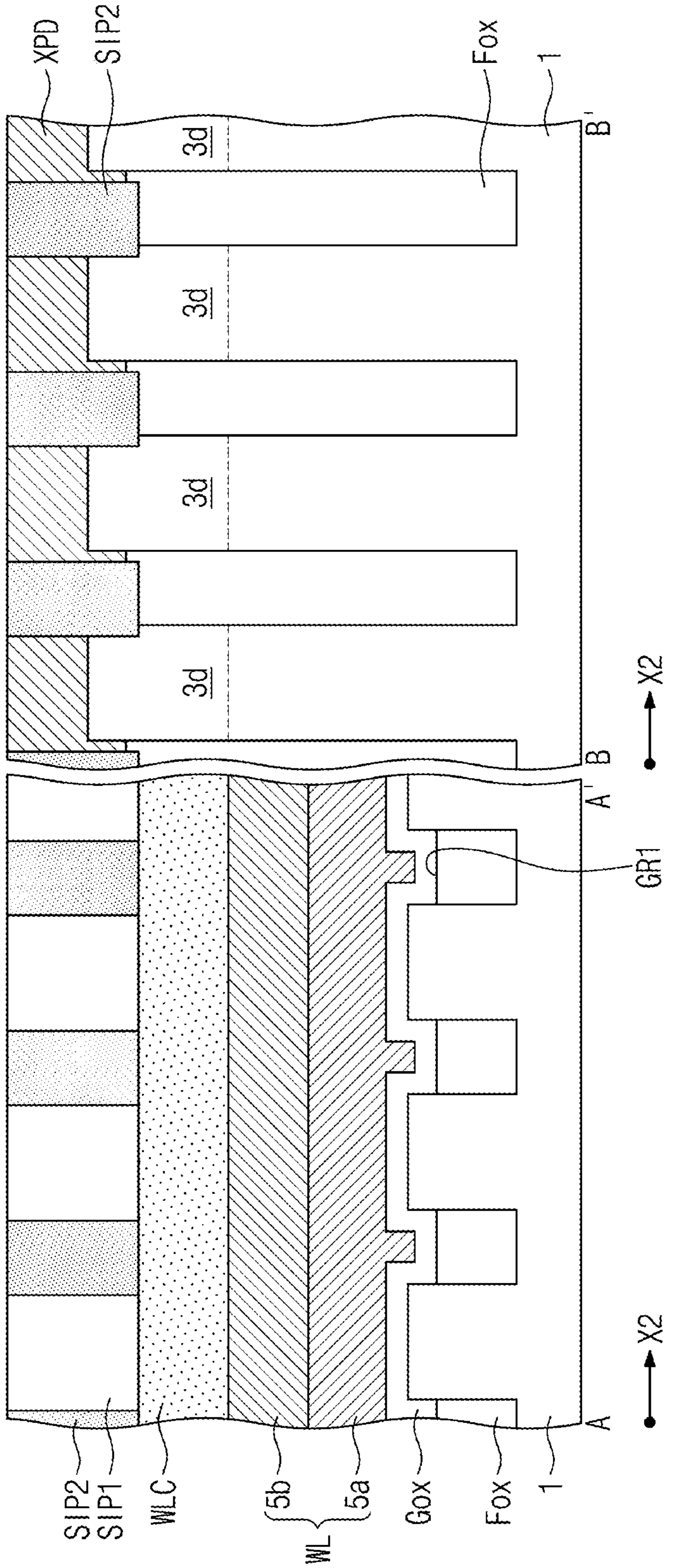
Figure 6C:
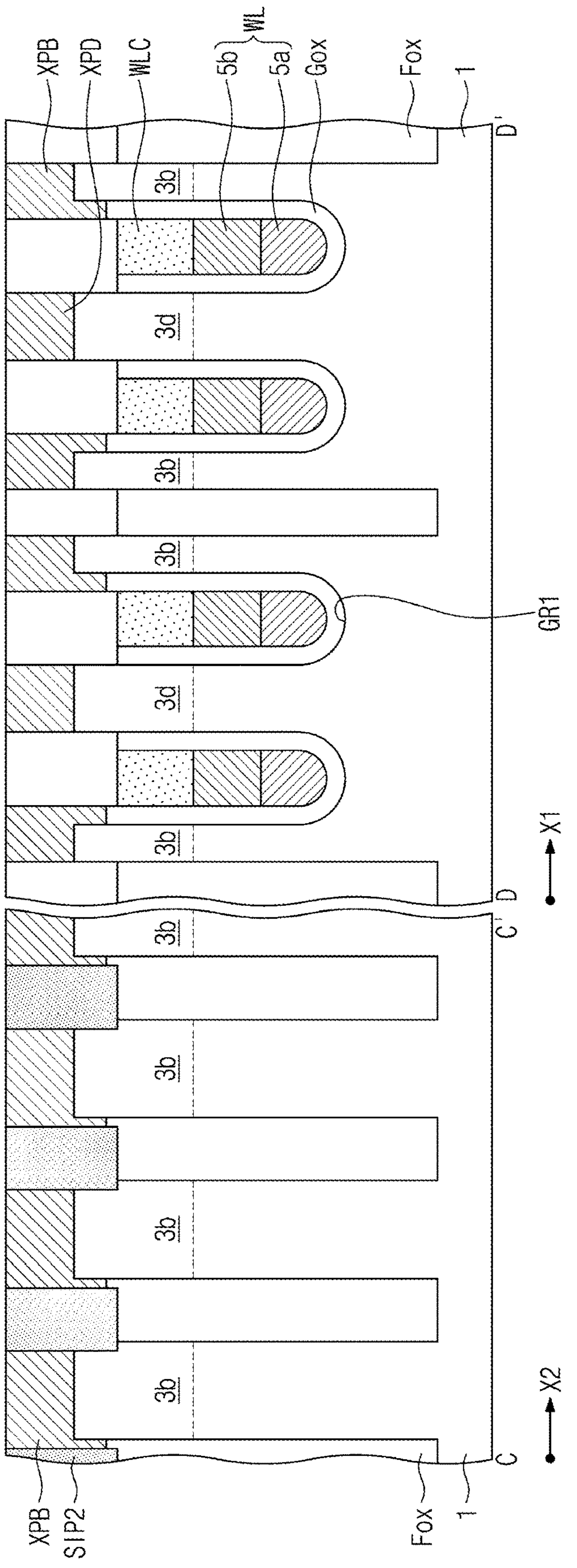
Figure 6D:
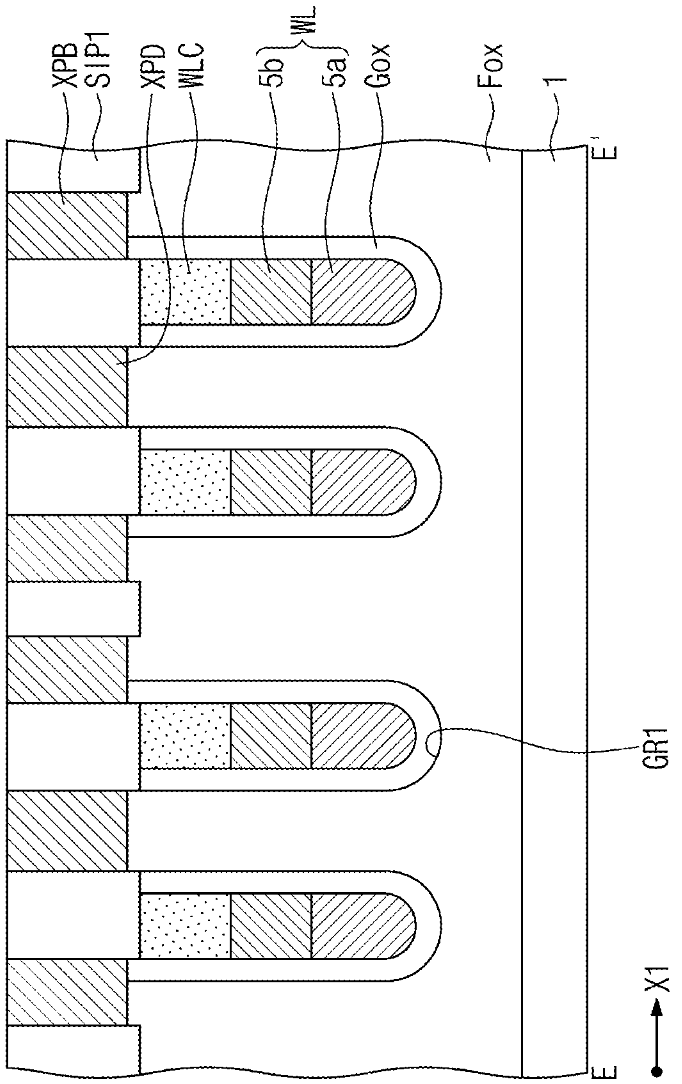
Figure 7A:
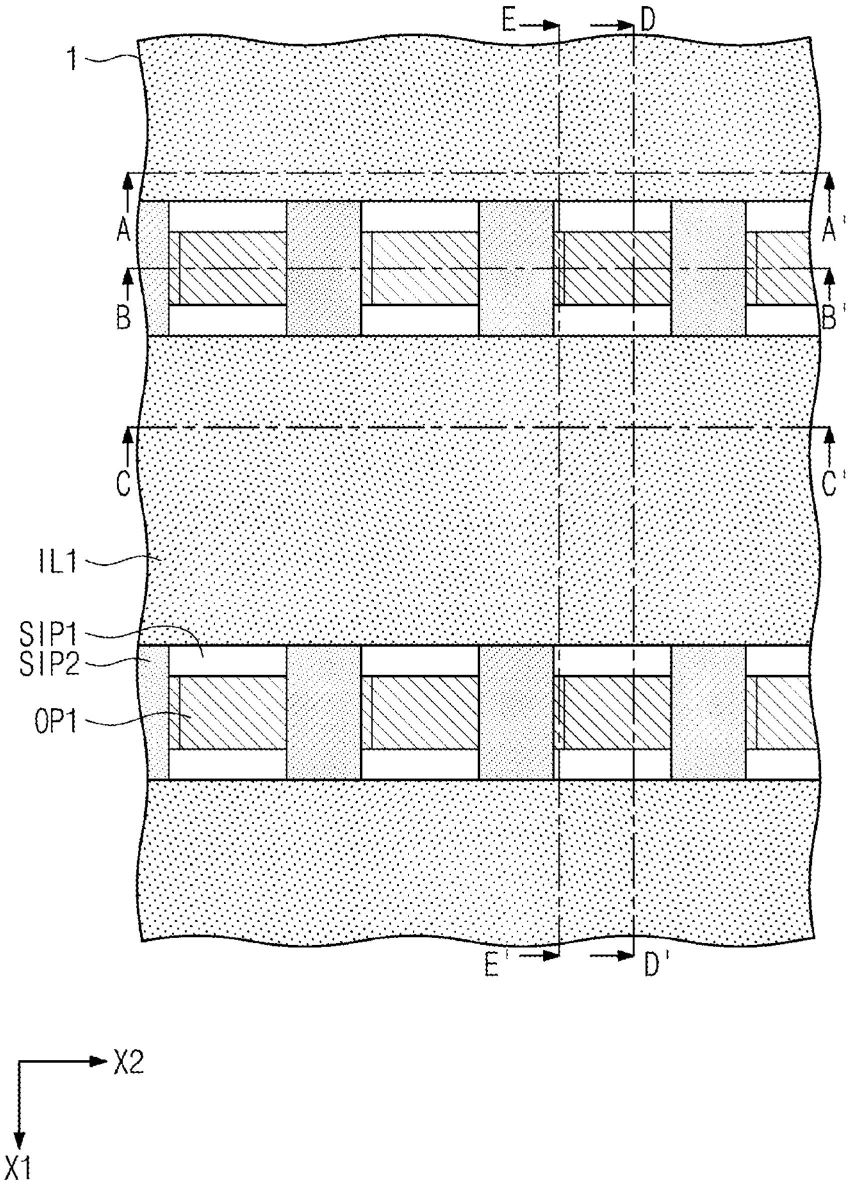
Figure 7B:
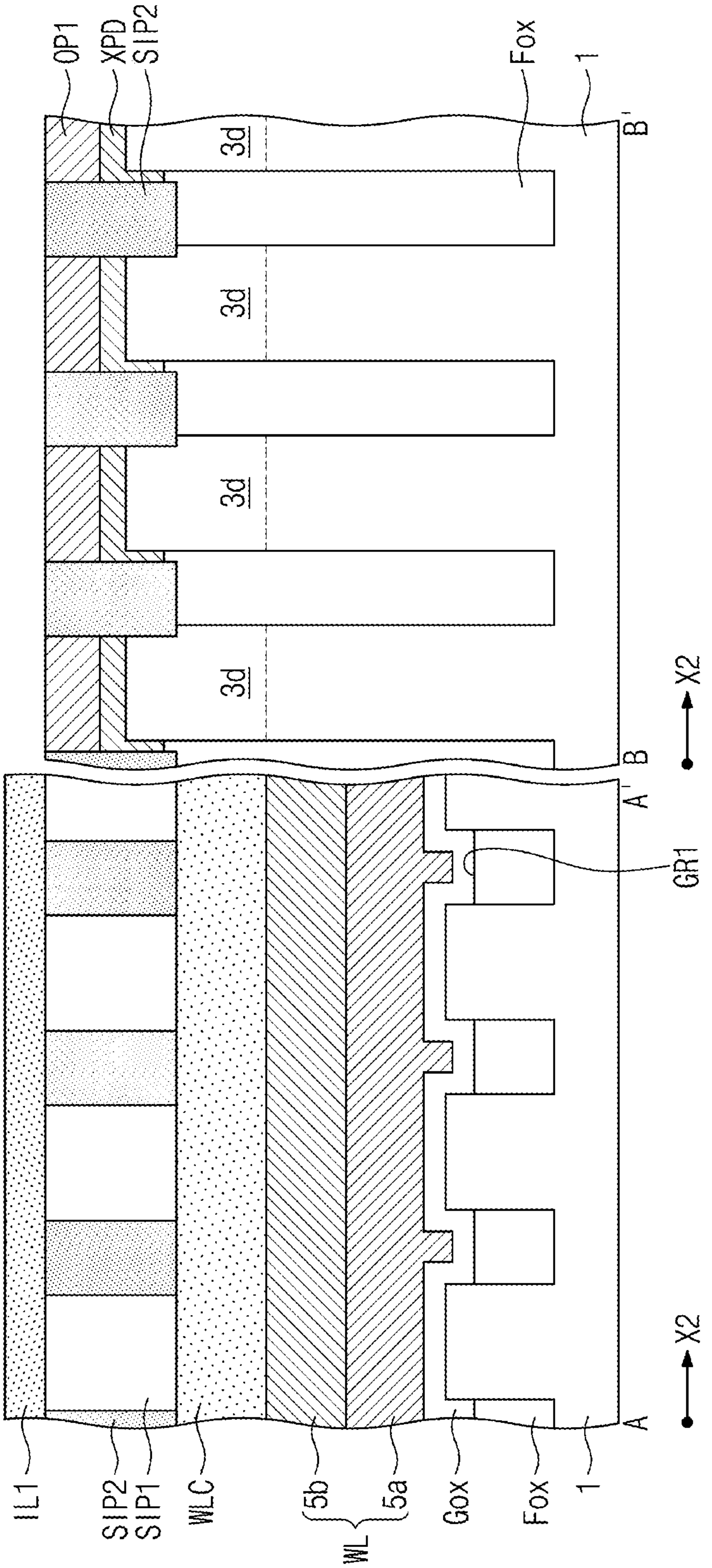
Figure 7C:
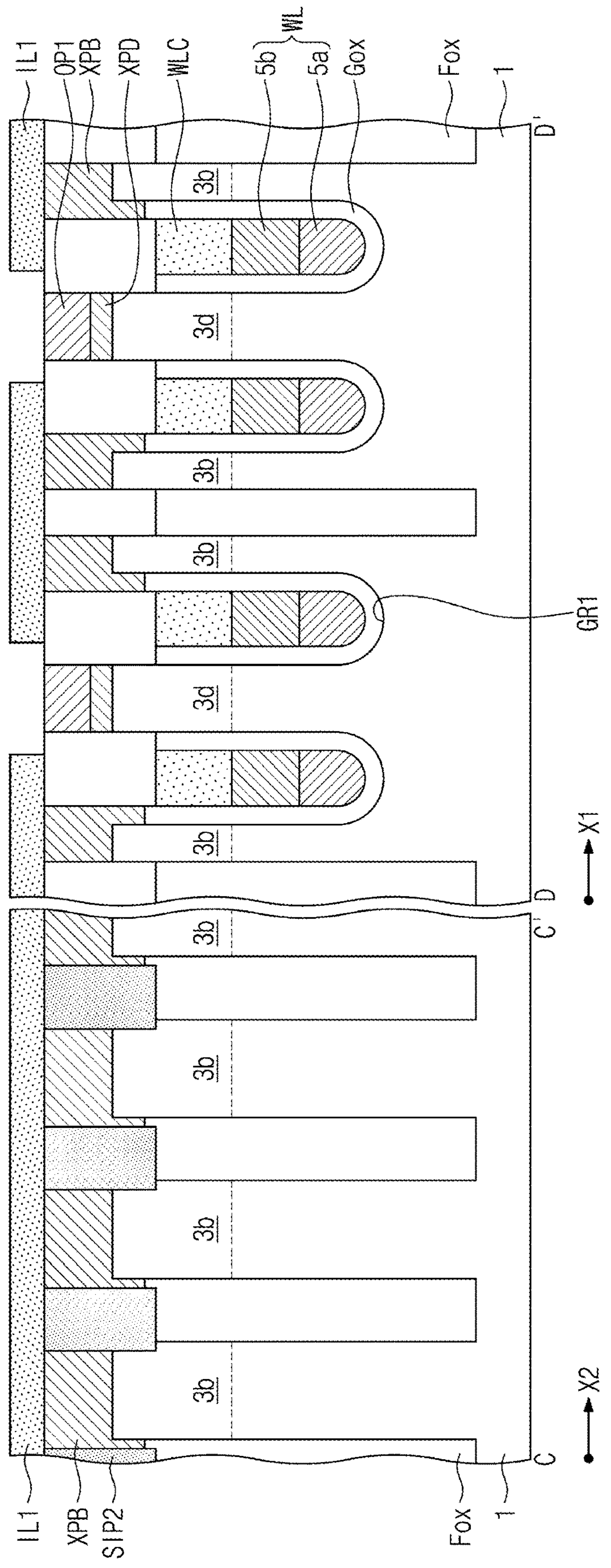
Figure 7D:
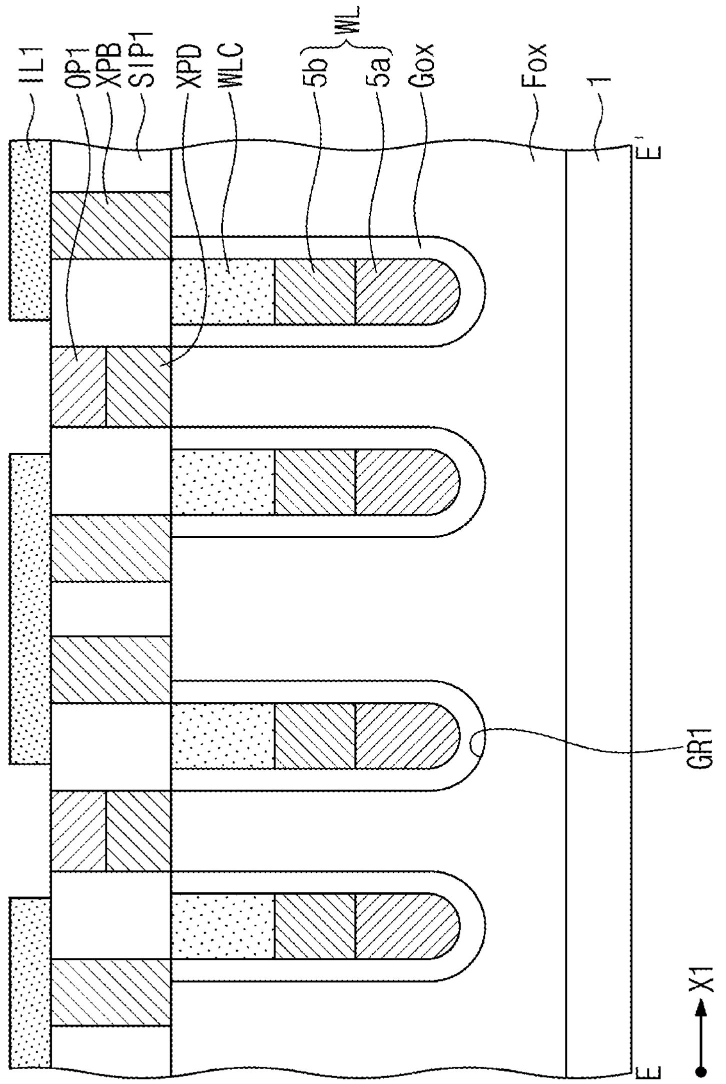
Figure 8A:
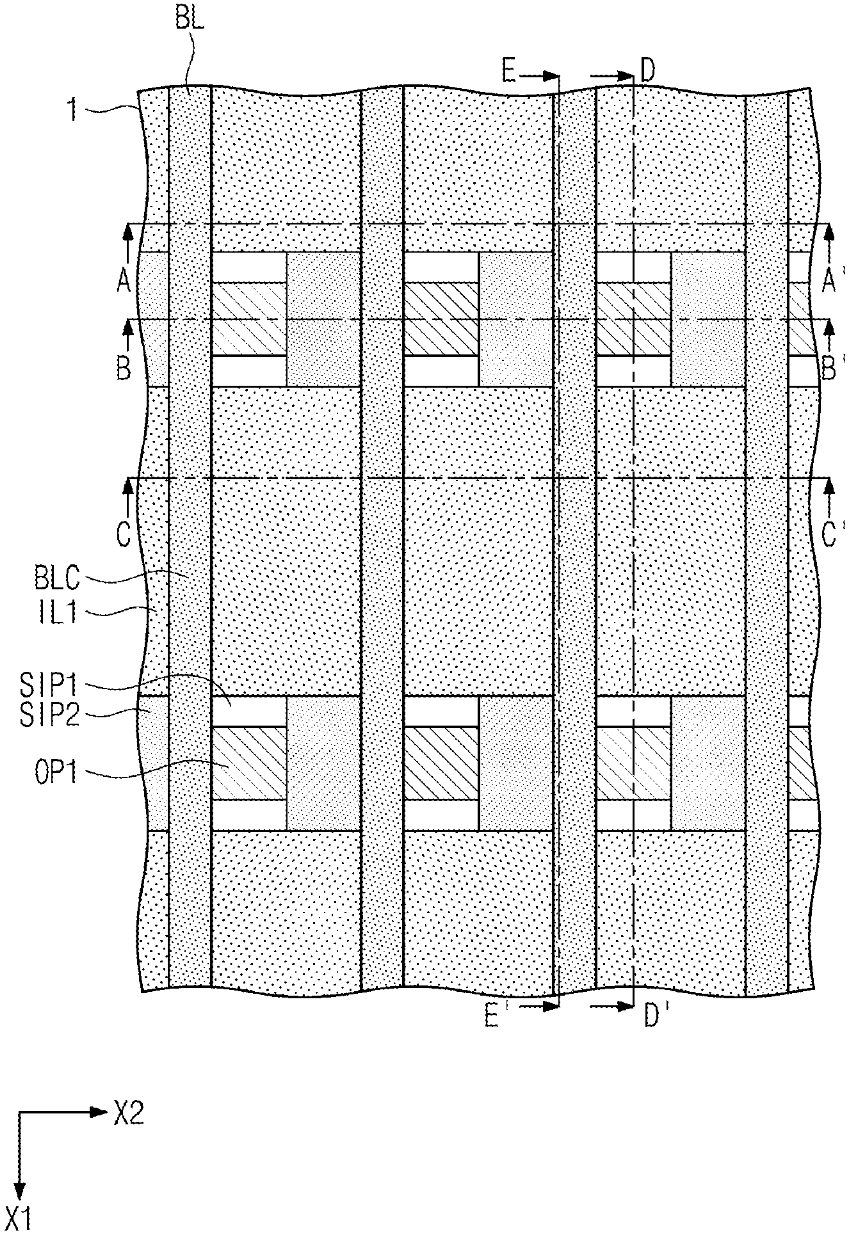
Figure 8B:
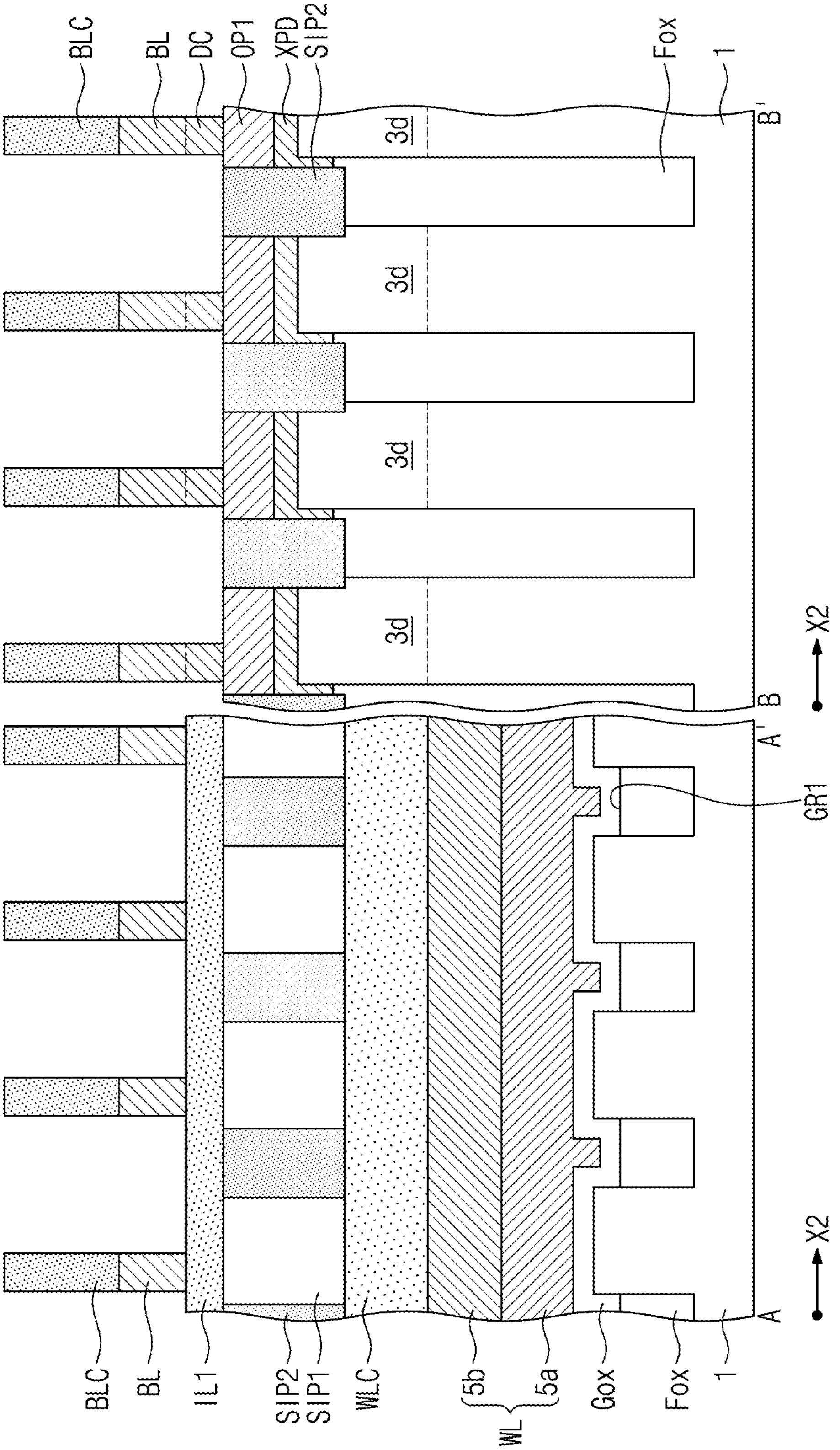
Figure 8C:
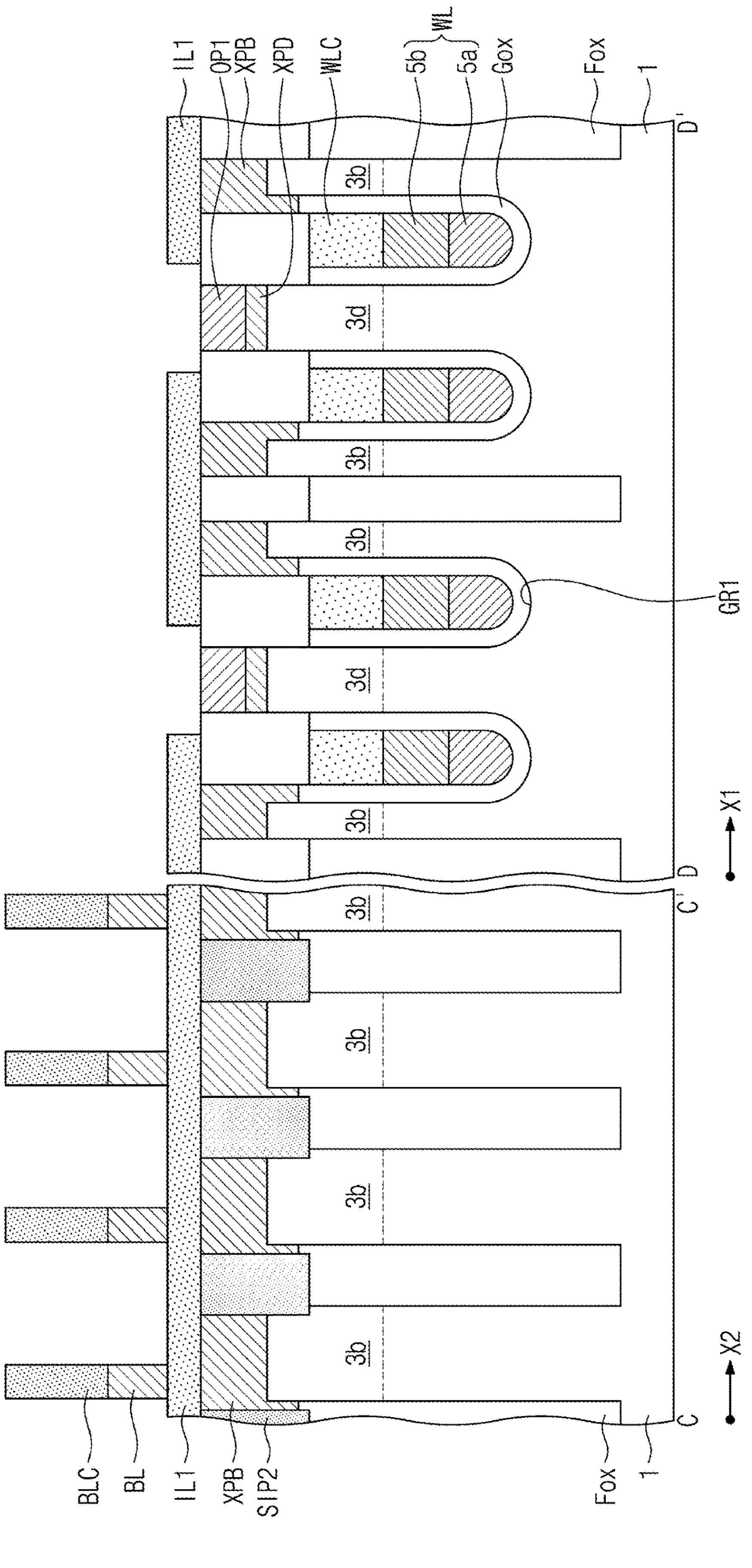
Figure 8D:
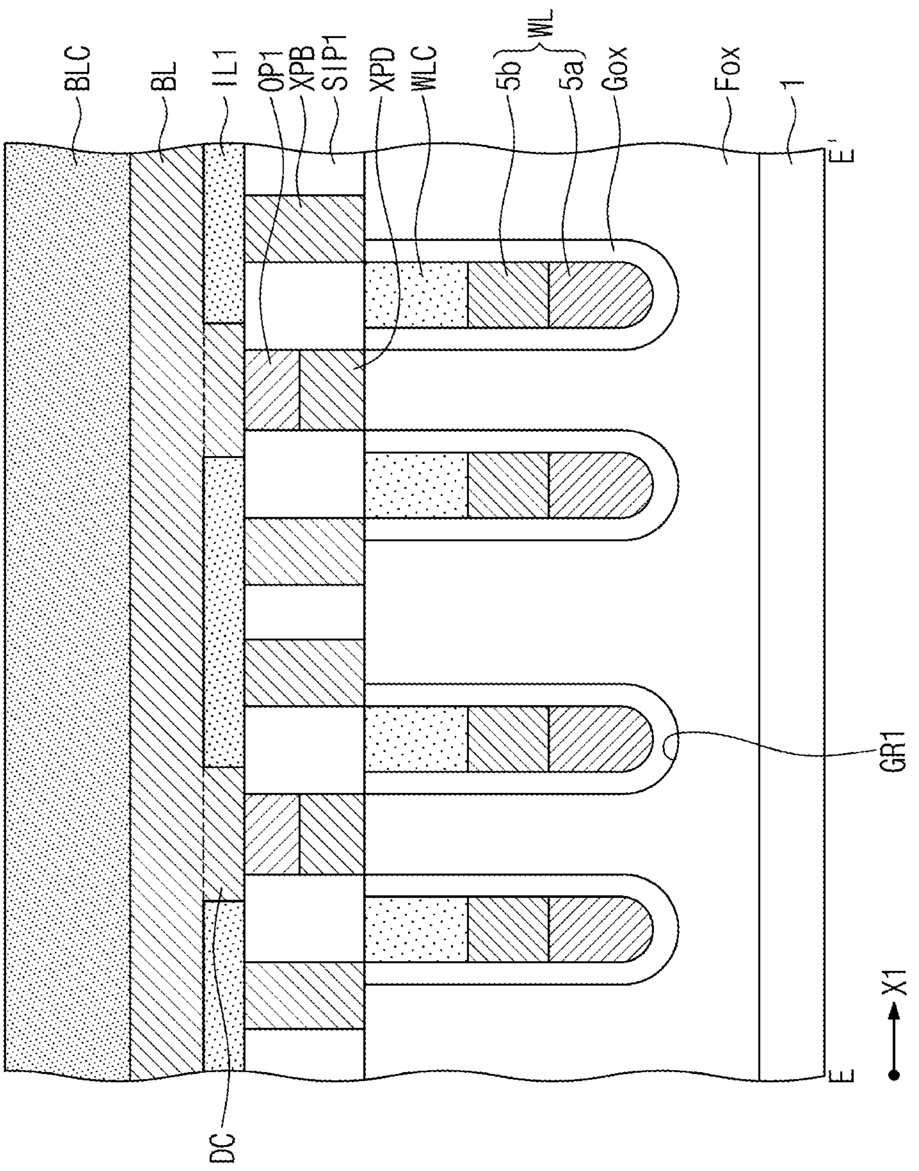

Referring to FIGS. 1B, 1C, and 6A, a first pad separation pattern SIP1 may be between the first conductive pad XPD and the second conductive pad XPB in the first direction X1. The first pad separation pattern SIP1 may have a rectangular shape as shown in FIG. 6A when viewed in a plan view. The first conductive pad XPD and second conductive pad XPB may be provided in plural. A second pad separation pattern SIP2 may be between the first conductive pads XPD in the second direction X2 in the B-B' cross section of FIG. 1B. The second pad separation pattern SIP2 may be between the second conductive pads XPB in the second direction X2 in the cross section C-C' of FIG. 1C. Each of the second pad separation patterns SIP2 may have a line shape extending in the first direction X1 when viewed in a plan view, as shown in FIG. 6A. The first pad separation pattern SIP1 and the second pad separation pattern SIP2 may each include the same or different insulating materials. Each of the first pad separation pattern SIP1 and the second pad separation pattern SIP2 may independently have a single-layer or multi-layer structure of a material, e.g., silicon oxide, silicon nitride, or silicon oxynitride.

As shown in FIGS. 1B and 1C, the levels LV1 and LV2 of the lower ends of the first conductive pads XPD and second conductive pads XPB may be lower than the upper surface of the substrate 1. As shown in FIGS. 1B and 1D, a first ohmic pattern OP1 may be on the first conductive pad XPD. The first ohmic pattern OP1 may include, e.g., a metal silicide such as cobalt silicide or titanium silicide. An upper surface of the first ohmic pattern OP1 may be coplanar with upper surfaces of the first pad separation pattern SIP1 and the second pad separation pattern SIP2. Upper surfaces of the second conductive pads XPB may be coplanar with the upper surfaces of the first pad separation pattern SIP1 and the second pad separation pattern SIP2.

The first conductive pads XPD, the second conductive pads XPB, the first pad separation pattern SIP1 and the second pad separation pattern SIP2 may be covered with a first interlayer insulating layer IL1. The first interlayer insulating layer IL1 may have a single layer or multilayer structure of a material, e.g., silicon oxide, silicon nitride, or silicon oxynitride.

Bit lines BL may be on the first interlayer insulating layer IL1. The bit lines BL may extend in the first direction X1 and may be spaced apart from each other in the second direction X2. The bit lines BL may cross the word line capping patterns WLC and word lines WL. The bit line BL may include a metal. In an implementation, the bit line BL may include, e.g., aluminum, tungsten, titanium, or ruthenium. When viewed in a plan view of FIG. 2, the bit line BL overlaps the first sidewall SW1 of the active region ACT and is spaced apart from the second sidewall SW2 of the active region ACT.

A bit line contact DC may be between the bit lines BL and the first ohmic pattern OP1. The bit line contact DC may correspond to a portion of the bit line BL protruding downwardly. Accordingly, the bit line contact DC may include the same material as the bit line BL. There may be no interface between the bit line contact DC and the bit line BL. Referring to FIG. 1D, the first ohmic pattern OP1 or the first conductive pad XPD has a first width WT1 in the first direction X1. The bit line contact DC may have a second width WT2 greater than the first width WT1 in the first direction X1.

In the present embodiment, both the bit line BL and the bit line contact DC may include metal, electrical resistance may be reduced, and thus operating speed of the semiconductor memory device may be improved and may be operated at low power. If the bit line BL or the bit line contact DC were to include polysilicon and a voltage were to be applied to the bit line BL or the bit line contact DC, a depletion phenomenon due to polysilicon could occur, and as a result, an electrical path reduction could occur. As a result, a bit line necking issue, e.g., an electrical disconnection phenomenon due to electrical resistance, could occur. In present embodiment, the both the bit line BL and the bit line contact DC may include a metal, and the bit line necking may be addressed.

As shown in FIG. 1B, a bit line capping pattern BLC may be on the bit line BL. The bit line capping pattern BLC may have a structure of at least one single layer or multilayer of, e.g., silicon oxide, silicon nitride, or silicon oxynitride. Sidewalls of the bit line BL and bit line capping pattern BLC may be covered with a first bit line spacer BS1. A sidewall of the first bit line spacer BS1 may be covered with a second bit line spacer BS2. Each of the first bit line spacer BS1 and the second bit line spacer BS2 may independently have a structure of at least one single layer or multiple layers including, e.g., silicon oxide, silicon nitride, or silicon oxynitride.

As shown in FIG. 1B, the first bit line spacer BS1 may include silicon nitride. The second bit line spacer BS2 may include silicon oxide. In this case, the first bit line spacer BS1 may have a first thickness TH1. The second bit line spacer BS2 may have a second thickness TH2 greater than the first thickness TH1. Silicon oxide has a smaller permittivity than silicon nitride. As a result, a ratio of silicon oxide having a relatively low permittivity between the bit line BL and the storage node contact structure BC may increase, and thus, interference between the bit line BL and the storage node contact structure BC may be reduced. Accordingly, bit line to buried contact disturbance (BBD) characteristics may be improved, and reliability of the semiconductor memory device may be improved.

As shown in FIG. 1C, an upper end of the second bit line spacer BS2 may be lower than an upper end of the first bit line spacer BS1, and an upper sidewall of the first bit line spacer BS1 may be exposed.

The storage node contact structures BC may be between the bit lines BL. The storage node contact structures BC may vertically overlap the second conductive pads XPB. Each of the storage node contact structures BC may include a first contact CT1 and a second contact CT2 sequentially deposited. The first contact CT1 and the second contact CT2 may independently include polysilicon doped with impurities, metal silicide, or a metal (e.g., non-compounded metal). Referring to FIG. 2, the storage node contact structures BC may be spaced apart from the first sidewall SW1 of the active region ACT and may overlap the second sidewall SW2.

As shown in FIG. 1C, the first contact CT1 may pass through the first interlayer insulating layer IL1 and may be in contact with the second conductive pad XPB. A portion of the first contact CT1 may be inserted into the second conductive pad XPB. A lower surface of the first contact CT1 may be rounded. As a result, a contact area between the first contact CT1 and the second conductive pad XPB may increase, thereby reducing electrical resistance and improving reliability of the semiconductor device. A portion of the first contact CT1 may be inserted into the first pad separation pattern SIP1 and the second pad separation pattern SIP2.

The storage node contact structure BC may have a 'T' shape structure. The second contact CT2 may cover an upper surface of the second bit line spacer BS2. A width of the second contact CT2 may be greater than that of the first contact CT1. In an implementation, as illustrated in FIG. 2, the first contact CT1 may have a third width WT3 and the second contact CT2 may have a fourth width WT4 in the second direction X2. In the first direction X1, the first contact CT1 may have a fifth width WT5, and the second contact CT2 may have a sixth width WT6. The fourth width WT4 may be greater than the third width WT3. The sixth width WT6 may be greater than the fifth width WT5. Accordingly, a misalignment margin between the second contact CT2 and a landing pad LP to be described may be increased, thereby improving reliability of the semiconductor device.

Figure 10A:
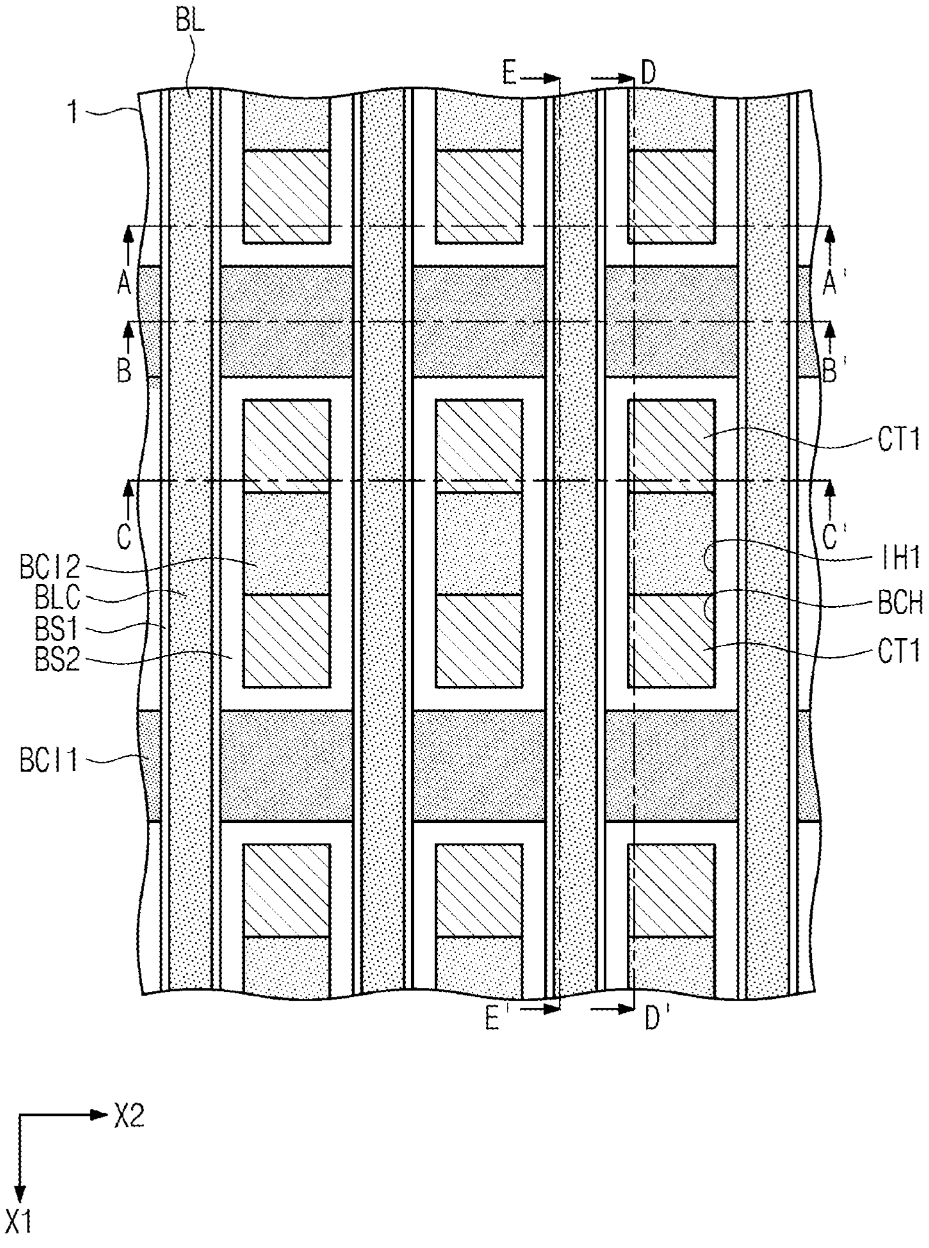

Referring to FIGS. 1C and 10A, first contact separation patterns BCI1 and second contact separation patterns BCI2 may be alternately and repeatedly disposed between the storage node contact structures BC in the first direction X1. Each of the first contact separation patterns BCI1 and the second contact separation patterns BCI2 may independently have a structure of at least one single layer or a multilayer including, e.g., silicon oxide, silicon nitride, or silicon oxynitride.

Referring to FIG. 1C, lower surfaces of the first contact separation patterns BCI1 and the second contact separation patterns BCI2 may be lower than a lower surface of the first contact CT1. The first contact separation pattern BCI1 may be inserted into or on the second pad separation pattern SIP2. A portion of the second contact separation pattern BCI2 may be inserted into or on the second conductive pad XPB. The second bit line spacer BS2 may be between the first contact CT1 and the first contact separation pattern BCI1. The first interlayer insulating layer IL1 may be between the first contact CT1 and the first contact separation pattern BCI1, under the second bit line spacer BS2. A first spacer remaining pattern BS1_R may be between the first interlayer insulating layer IL1 and the first contact separation pattern BCI1 under the second bit line spacer BS2. The first spacer remaining pattern BS1_R may include the same material as the first bit line spacer BS1.

Figure 12:
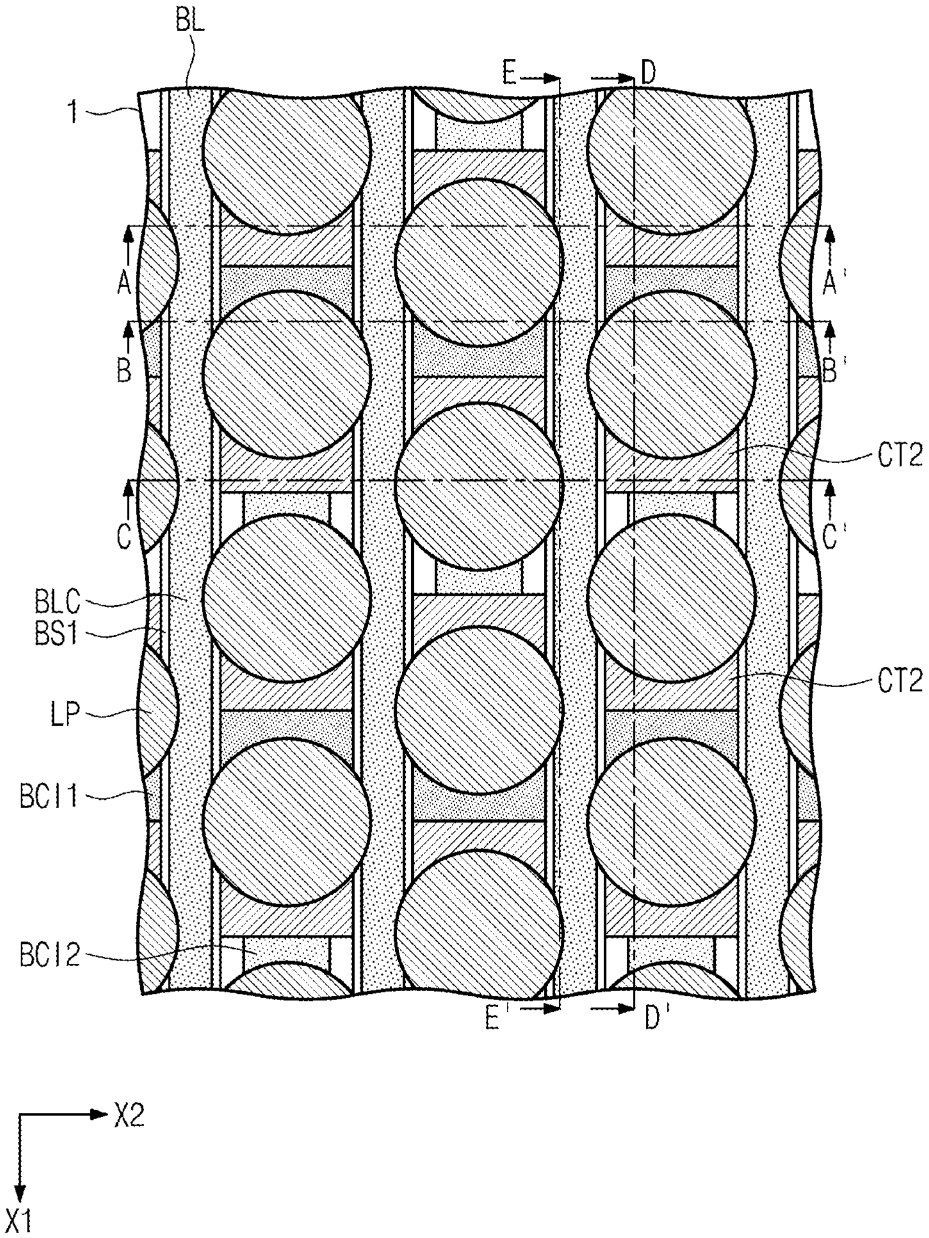

Landing pads LP may be on the storage node contact structures BC, respectively. Each of the landing pads LP may include a metal, e.g., tungsten. The landing pads LP may be in contact with the second contact CT2. The landing pads LP may partially cover upper surfaces of the first and second contact separation patterns BCI1 and BCI2, respectively, as shown in FIG. 1C. When viewed in a plan view of FIG. 12, the landing pads LP may have island shapes spaced apart from each other. The landing pads LP may be arranged in a honeycomb shape.

A landing pad separation pattern LIP may be between the landing pads LP. The landing pad separation pattern LIP may have a structure of at least one single layer or multilayer including, e.g., silicon oxide, silicon nitride, or silicon oxynitride. The landing pad separation pattern LIP may be inserted into the bit line capping pattern BLC and the first bit line spacer BS1 as shown in FIGS. 1B to 1D. The landing pad separation pattern LIP may be inserted into the first and second contact separation patterns BCI1 and BCI2.

In an implementation, data storage patterns may be on each of the landing pads LP. The data storage patterns may be capacitors including a lower electrode, a dielectric layer, and an upper electrode. In this case, the semiconductor device 100 may be a dynamic random-access memory (DRAM). In an implementation, the data storage patterns may include magnetic tunnel junction patterns. In this case, the semiconductor device 100 may be a magnetic random access memory (MRAM). In an implementation, the data storage patterns may include a phase change material or a variable resistance material. In this case, the semiconductor device 100 may be a phase-change random access memory (PRAM) or a resistive RAM (ReRAM).

FIGS. 3A to 11A and 12 are plan views of stages in a method of manufacturing the semiconductor device of FIG. 1A. FIGS. 3B to 11B are cross-sectional views of stages in a method of manufacturing the semiconductor device of FIG. 1B. FIGS. 3C to 11C are cross-sectional views of stages in a method of manufacturing the semiconductor device of FIG. 1C. FIGS. 3D to 8D are cross-sectional views of stages in a method of manufacturing the semiconductor device of FIG. 1D.

Referring to FIGS. 3A to 3D, active regions ACT may be defined by forming device isolation parts Fox on the substrate 1. The forming of the device isolation part Fox may include forming mask patterns on the substrate 1, etching the substrate 1 to form trenches TR1, and filling the trenches TR1 with an insulating material. The active regions ACT may include first to fourth active regions ACT(1) to ACT(4) sequentially arranged in a clockwise direction. The first and second active regions ACT(1) and ACT(2) may be spaced apart from each other in a second direction X2. The fourth and third active regions ACT(4) and ACT(3) may be spaced apart from each other in the second direction X2. The first and second active regions ACT(1) and ACT(2) may be spaced apart from the fourth and third active regions ACT(4) and ACT(3) in a first direction X1.

The mask patterns may be formed using a Litho Etch Litho Etch (LELE) manner. The mask patterns may include first mask patterns and second mask patterns. The first mask patterns may define positions and shapes of odd-numbered active regions ACT(1) and ACT(3). The second mask patterns may define positions and shapes of even-numbered active regions ACT(2) and ACT(4). The first mask patterns may be formed by a first photolithography process. The second mask patterns may be formed by a second photolithography process. In the present disclosure, a relationship between the first and second distances DS1 and DS2 disclosed in FIG. 4A may be satisfied, even when the second mask patterns are partially misaligned, and a certain distance or more may be maintained from the first mask patterns. Accordingly, when the second mask patterns are formed by improving the misalignment margin, process difficulty may be reduced and scalability may be maximized, thereby reducing process defects. As a result, yield and reliability of the semiconductor device may be improved.

Referring to FIGS. 4A to 4D, the active regions ACT and the device isolation part Fox may be patterned to form grooves GR1. At this time, etching conditions for the substrate 1 and the device isolation part Fox may be adjusted such that the device isolation part Fox may be more easily etched than the substrate 1. As a result, bottom surfaces of the grooves GR1 may be curved. A gate insulating layer Gox may be conformally formed in the grooves GR1. The gate insulating layer Gox may be formed through a thermal oxidation process, a chemical vapor deposition process, or an atomic layer deposition process. A first gate conductive layer may be deposited to fill the grooves GR1 and etched back to form a first word line pattern 5*a*. The first word line pattern 5*a* may fill lower portions of the grooves GR1. A second gate conductive layer may be deposited to fill the grooves GR1 and etched back to form a second word line pattern 5*b*. The second word line pattern 5*b* may fill a middle portion of the grooves GR1. The first word line pattern 5*a* and the second word line pattern 5*b* constitute a word line WL. An insulating layer, e.g., a silicon nitride layer, may be deposited on the substrate 1 to fill the grooves GR1 and then etched to form a word line capping pattern WLC on each of the word lines WL. Dopants may be implanted into the active regions ACT using the word line capping patterns WLC and the device isolation part Fox as a mask to first and second impurity regions 3*d* and 3*b*.

Referring to FIGS. 5A to 5D, a portion of the device isolation part Fox is removed to expose an upper sidewall 1_S of the substrate 1. In this case, a portion of the gate insulating layer Gox may be removed, and upper sidewalls of the word line capping patterns WLC may be exposed. A pad layer may be deposited on the entire surface of the substrate 1. The pad layer may be a polysilicon layer doped with impurities. The pad layer may be formed by in-situ doping with impurities while depositing a polysilicon layer. The pad layer may be in contact with the upper sidewall 1_S of the substrate 1. The pad layer may be etched to form preliminary pad patterns XPP. Each of the preliminary pad patterns XPP may have a line shape extending in the second direction X2. The preliminary pad patterns XPP may overlap the first and second impurity regions 3*d* and 3*b*, respectively. The word line capping patterns WLC may be exposed between preliminary pad patterns XPP. The preliminary pad patterns XPP may overlap a portion of the gate insulating layer Gox. A first pad separation layer may be deposited on the substrate 1 and etched back to expose upper surfaces of the preliminary pad patterns XPP, while forming first pad separation patterns SIP1 between the preliminary pad patterns XPP, respectively. The first pad separation patterns SIP1 may overlap the word line capping patterns WLC. Each of the first pad separation patterns SIP1 may have a line shape extending in the second direction X2.

Referring to FIGS. 6A to 6D, the preliminary pad patterns XPP may be cut (or etched) in the first direction X1 to form first conductive pads XPD and second conductive pads XPB. Accordingly, each of the first conductive pads XPD and the second conductive pads XPB may be formed to have a rectangular shape. The first conductive pads XPD may overlap the first impurity regions 3*d*. The second conductive pads XPB may overlap the second impurity regions 3*b*, respectively. When the preliminary pad patterns XPP are etched, the first pad separation patterns SIP1 may also be etched to have a rectangular shape. The preliminary pad patterns XPP and the first pad separation pattern SIP1 may be etched and upper surfaces of the device isolation part Fox and upper surfaces of the word line capping patterns WLC may be partially exposed. A pad separation layer may fill a portion where the preliminary pad patterns XPP and the first pad separation pattern SIP1 are etched and may be etched back to expose upper surfaces of the first conductive pads XPD, the second conductive pads XPB, and the first pad separation patterns SIP1 while forming second pad separation patterns SIP2. The second pad separation patterns SIP2 may have a line shape extending in the first direction X1.

Referring to FIGS. 7A to 7D, first interlayer insulating layers IL1 may be formed on the second conductive pads XPB, the first pad separation patterns SIP1, and the second pad separation patterns SIP2. The first interlayer insulating layers IL1 may have a line shape extending in the second direction X2. The first conductive pads XPD, a portion of the second pad separation patterns SIP2, and a portion of the first pad separation patterns SIP1 may be exposed between the first interlayer insulating layers IL1. A metal layer may be deposited on the first interlayer insulating layers IL1, the metal layer may be in contact with the first conductive pads XPD, and then an annealing process may be performed to form first ohmic patterns OP1. The metal of the metal layer may combine with silicon of the first conductive pads XPD to form a metal silicide constituting the first ohmic patterns OP1. After the annealing process, the unreacted metal layer may be removed, and upper surfaces of the first interlayer insulating layers IL1, a portion of the second pad separation patterns SIP2, and a portion of the first pad separation patterns SIP1 may be exposed. In the annealing process, the second pad separation patterns SIP2 may be covered with the first interlayer insulating layers IL1, and the ohmic pattern may not be formed on the second pad separation patterns SIP2.

Referring to FIGS. 8A to 8D, a bit line conductive layer may be formed on the entire surface of the substrate 1 to fill a space between the first interlayer insulating layers IL1. A bit line capping layer may be formed on the bit line conductive layer. Third mask patterns may be formed on the bit line capping layer. The bit line capping layer and the bit line conductive layer may be sequentially etched using the third mask patterns as an etch mask to form bit line capping patterns BLC and bit lines BL. A bit line contact DC may be formed under the bit lines BL. When viewed in a plan view, the bit line capping patterns BLC and the bit lines BL may have a line shape extending in the first direction X1. The first ohmic patterns OP1, a portion of the second pad separation patterns SIP2, and a portion of the first pad separation patterns SIP1 may be exposed between the bit lines BL.

Figure 9A:
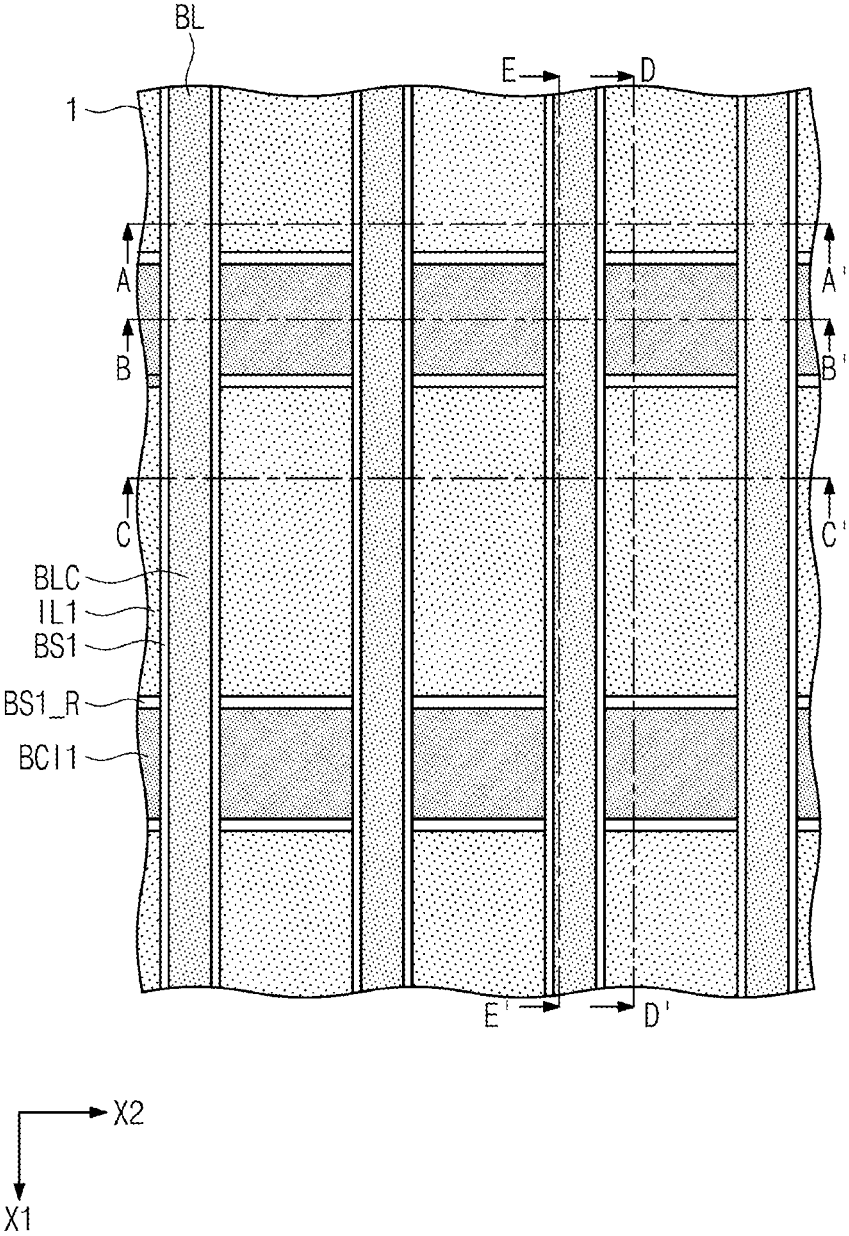
Figure 9B:
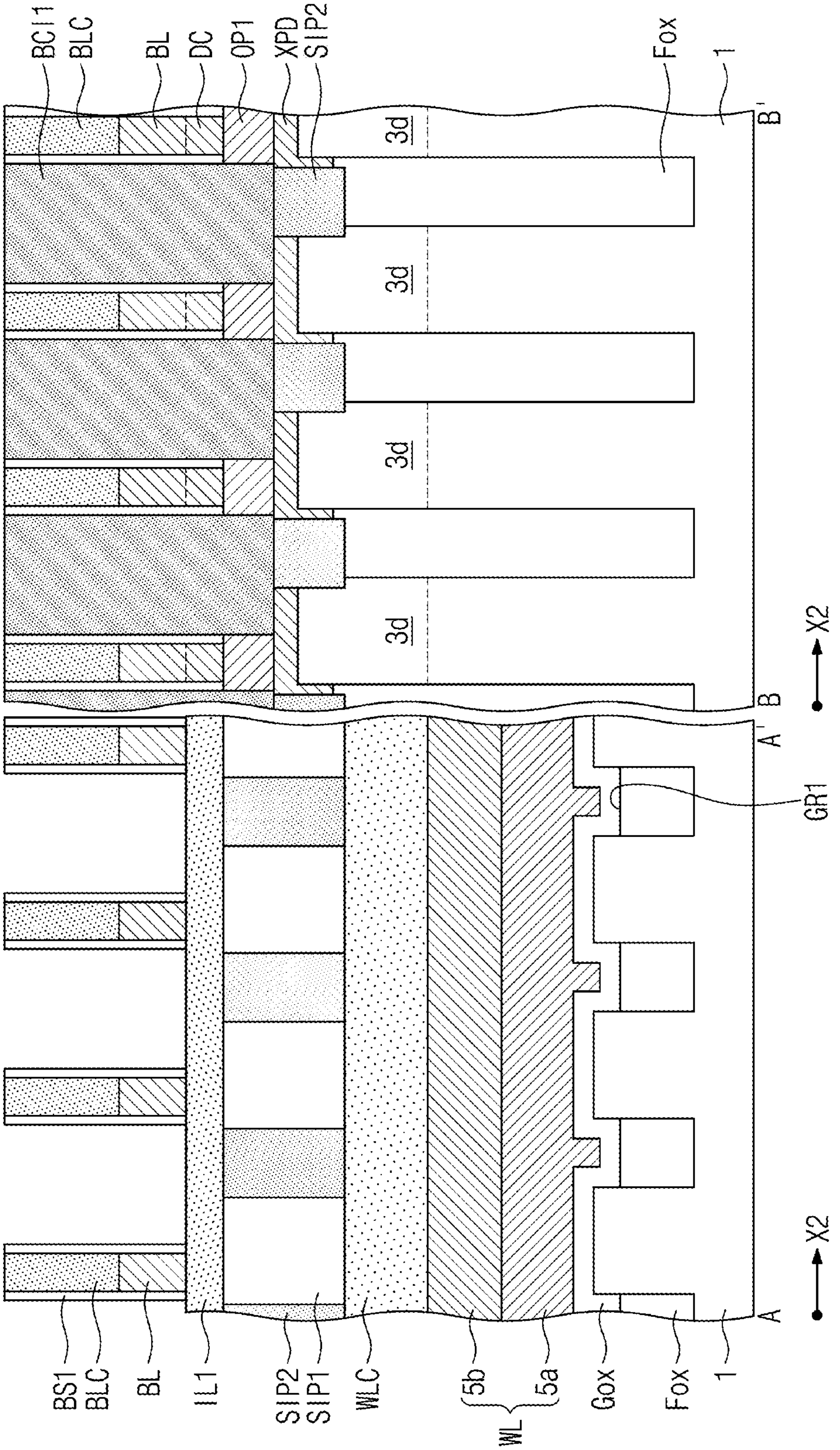
Figure 9C:
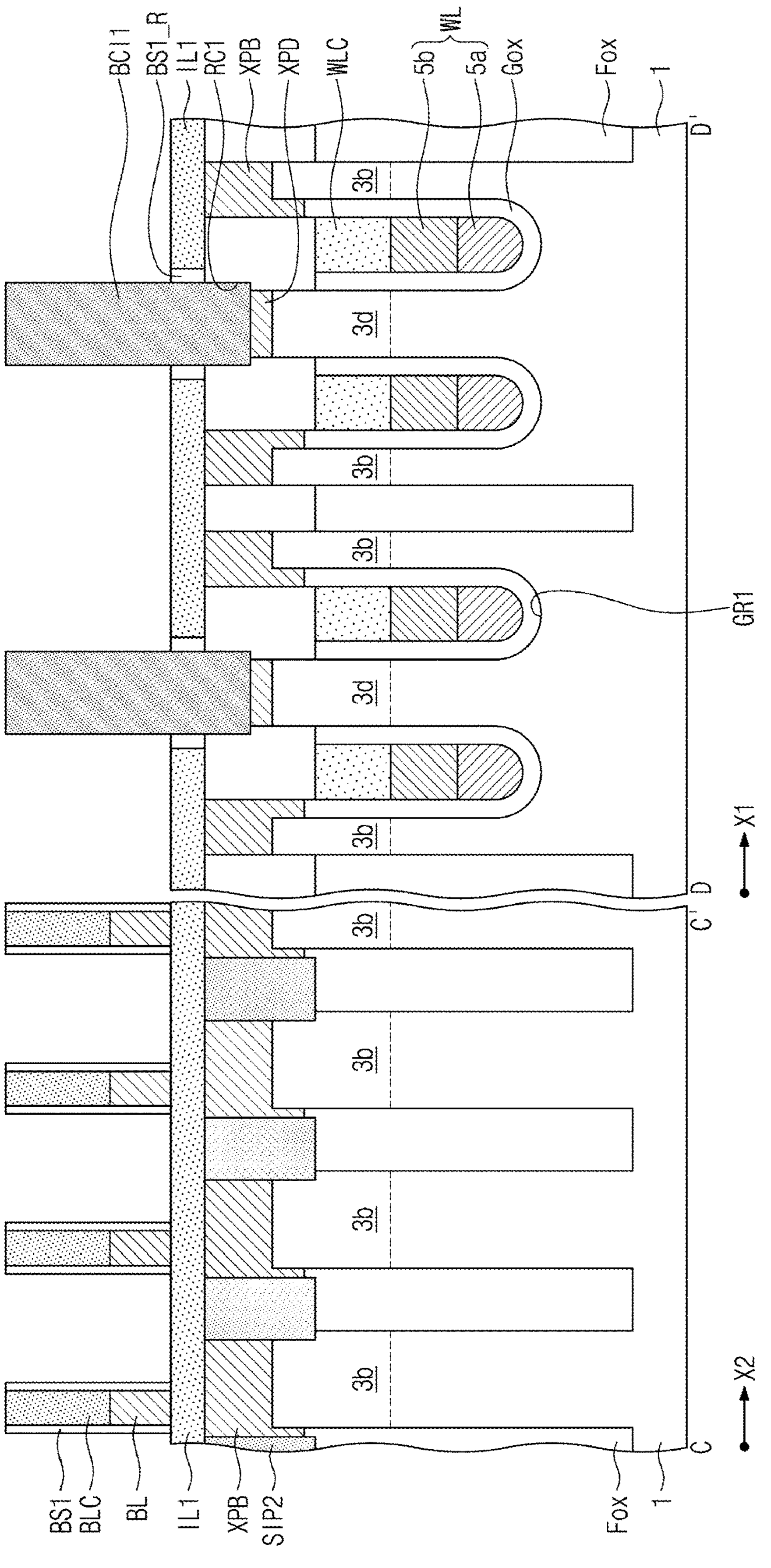

Referring to FIGS. 9A to 9C, a first spacer layer may be conformally deposited on the entire surface of the substrate 1 and anisotropically etched to form a first bit line spacer BS1 covering sidewalls of the bit line capping patterns BLC and bit lines BL. A cross section of FIG. 9A taken along the line E-E' may be the same as or similar to that of FIG. 8D. A portion of the first spacer layer may cover the sidewall of the first interlayer insulating layer IL1 to form a first spacer remaining pattern BS1_R, as shown in a cross section of FIG. 9C taken along the line D-D'. A portion of the first ohmic patterns OP1 and the second pad separation patterns SIP2 next to the bit lines BL may also be etched by the anisotropic etching process. As a result, the first recess region RC1 may be formed on the second pad separation patterns SIP2 as shown in the cross section D-D' of FIG. 9C. A first contact separation pattern layer may be deposited and patterned on the entire surface of the substrate 1 to form first contact separation patterns BCI1 and to expose upper surfaces of the bit line capping patterns BLC. The first contact separation patterns BCI1 may be arranged in one column in the second direction X2. A portion of the first contact separation patterns BCI1 may be positioned in the first recess region RC1.

Figure 10B:
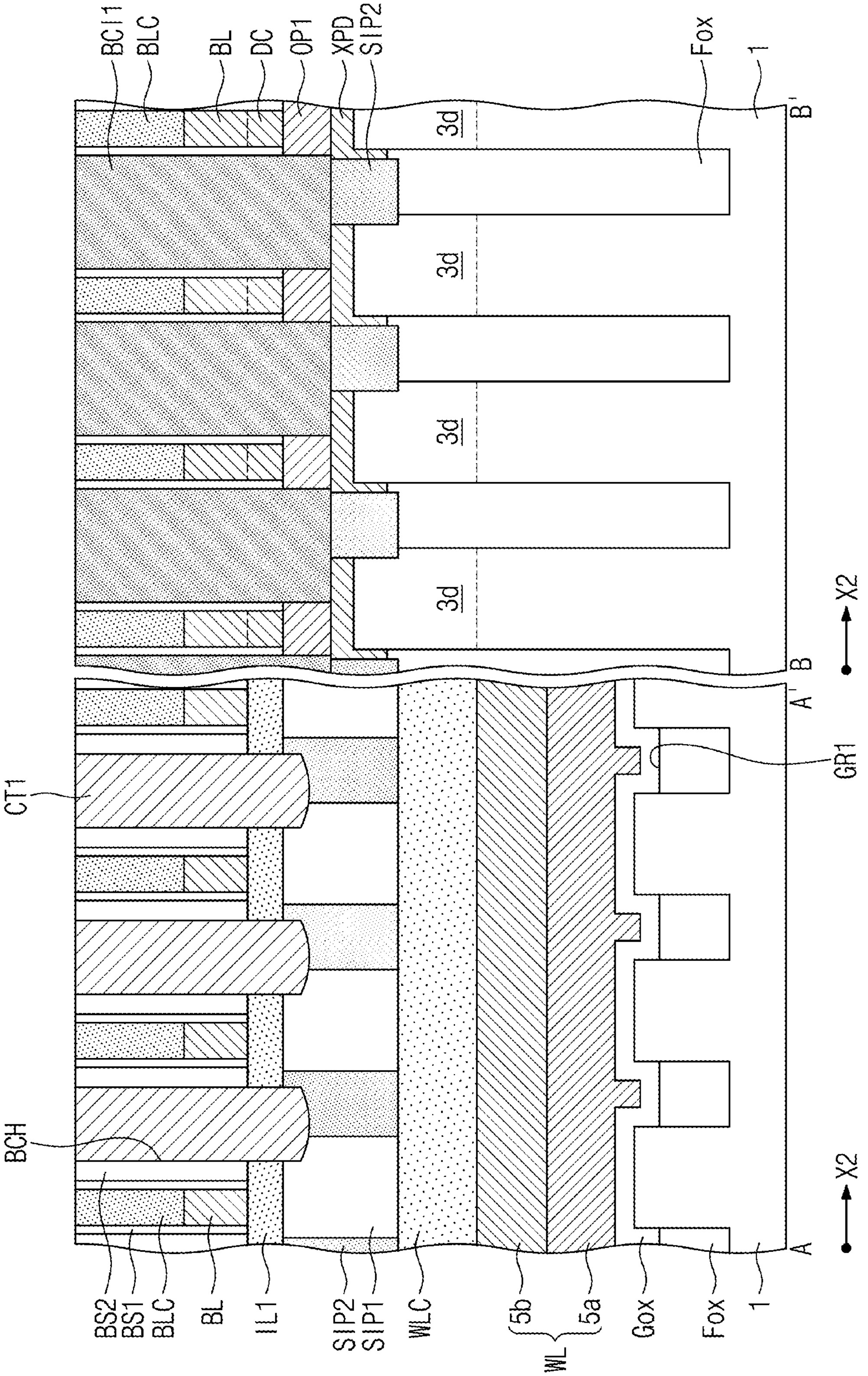
Figure 10C:
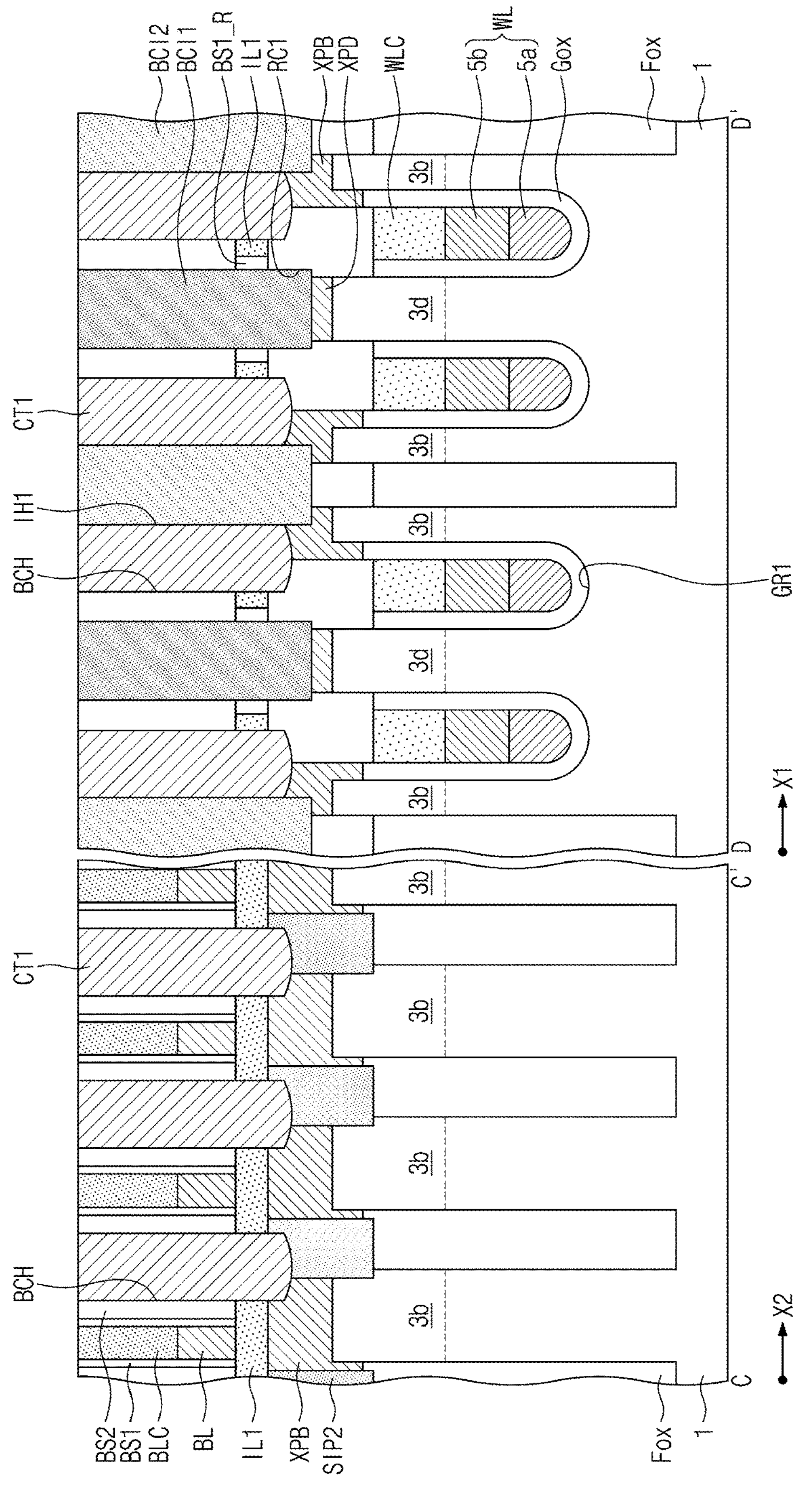

Referring to FIGS. 10A to 10C, a second spacer layer may be conformally deposited on the entire surface of the substrate 1 and anisotropically etched to form second bit line spacers BS2, and the first interlayer insulating layer IL1 may be exposed between the first contact separation patterns BCI1 in the first direction X1. A cross section of FIG. 10A taken along the line E-E' may be the same as/similar to that of FIG. 8D. Referring to FIG. 10A, the second bit line spacers BS2 may have a quadrangular closed curve shape when viewed in a plan view. The second bit line spacers BS2 cover sidewalls of the first bit line spacer BS1 and sidewalls of the first contact separation patterns BCI1. The first interlayer insulating layer IL1 may be anisotropically etched using the second bit line spacers BS2 as an etch mask to form contact hole BCH of FIG. 10C exposing the second conductive pads XPB under the first interlayer insulating layer IL1. At this time, as shown in FIG. 10B, a portion of the second pad separation patterns SIP2 and parts of the first pad separation patterns SIP1 may also be etched. One contact hole BCH may simultaneously expose two second conductive pads XPB adjacent in the first direction X1. A first contact layer may be formed on the entire surface of the substrate 1 and may be etched back to form a first preliminary contact pattern in the contact hole BCH, and upper surfaces the second bit line spacer BS2, bit line capping patterns BLC, and first contact separation patterns BCI1 may be exposed. The first preliminary contact pattern may be formed of polysilicon doped with impurities. One first preliminary contact pattern may be in contact with two adjacent second conductive pads XPB. The first preliminary contact patterns may be anisotropically etched to form first contacts CT1. In this case, one first preliminary contact pattern may be etched to form two first contacts CT1 in one contact hole BCH. A first separation hole IH1 of FIG. 10C may be formed between the first contacts CT1. A portion of the second conductive pads XPB and a portion of the first pad separation pattern SIP1 may be etched through the anisotropic etching process. A second contact separation pattern layer may be deposited on the entire surface of the substrate 1 to fill the first separation hole IH1 and may be etched back. Thus, a second contact separation pattern BCI2 may be formed in the first separation hole IH1, upper surfaces of the first contacts CT1, first contact separation patterns BCI1, and bit line capping patterns BLC may be exposed.

Figure 11A:
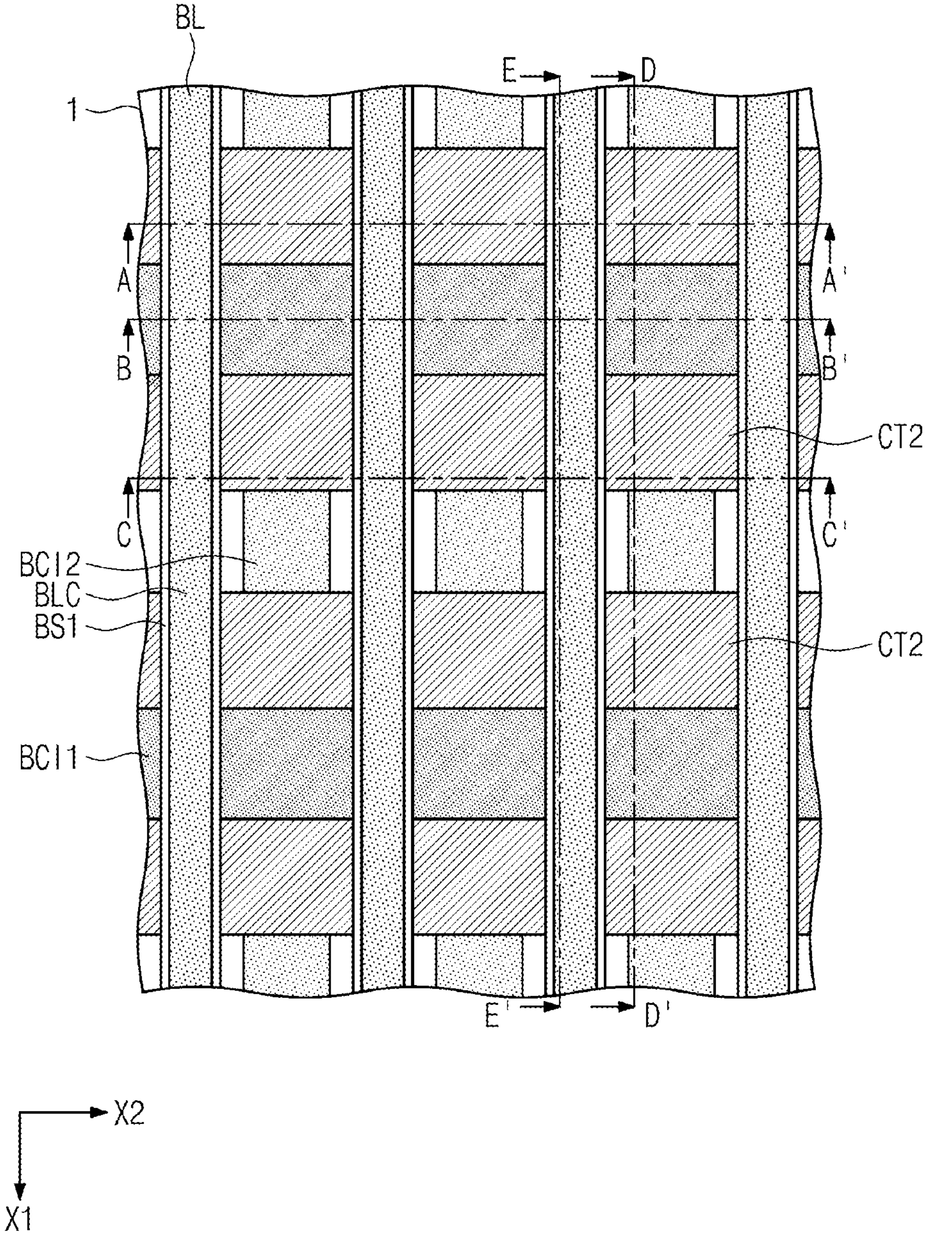
Figure 11B:
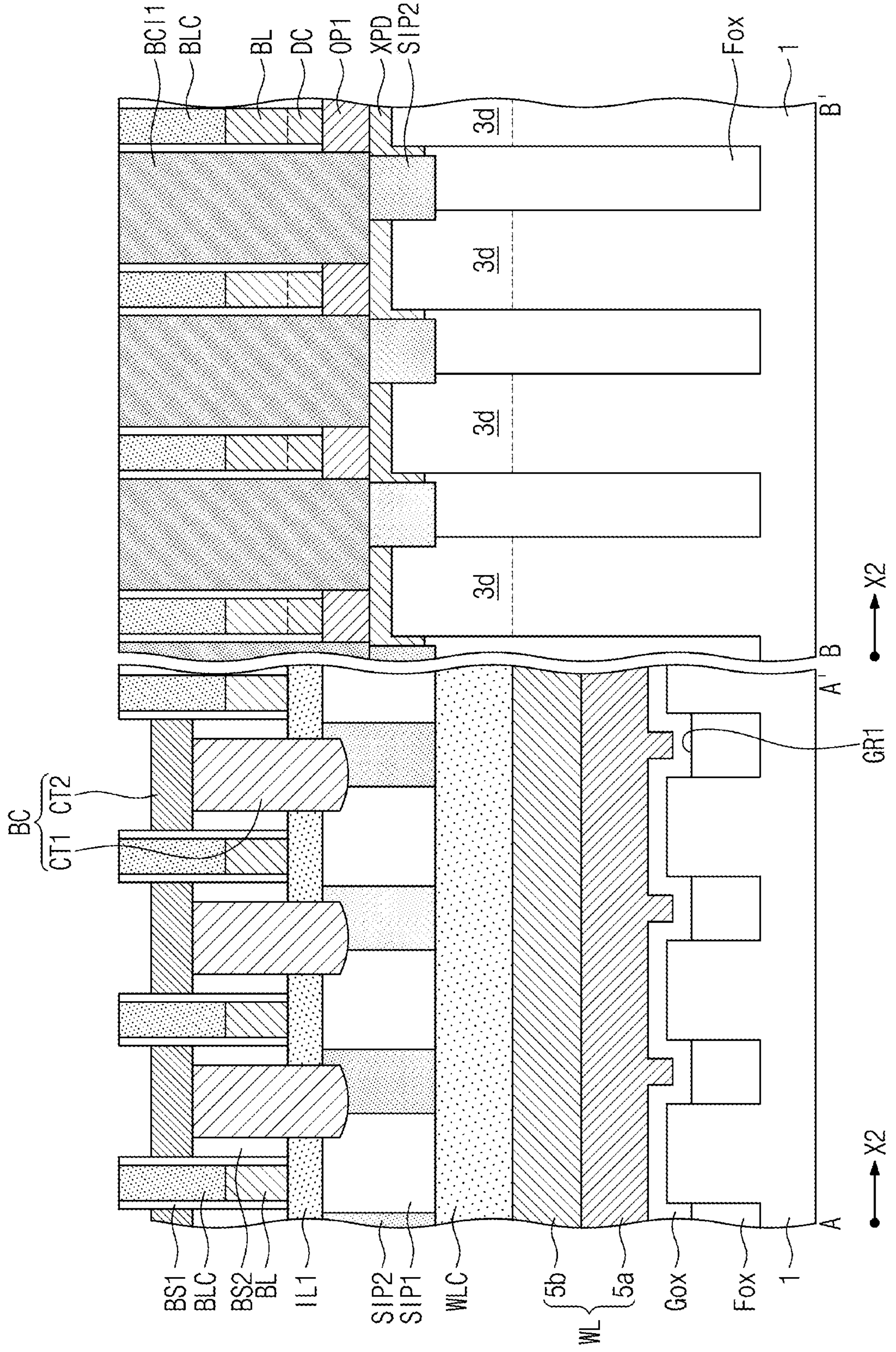
Figure 11C:
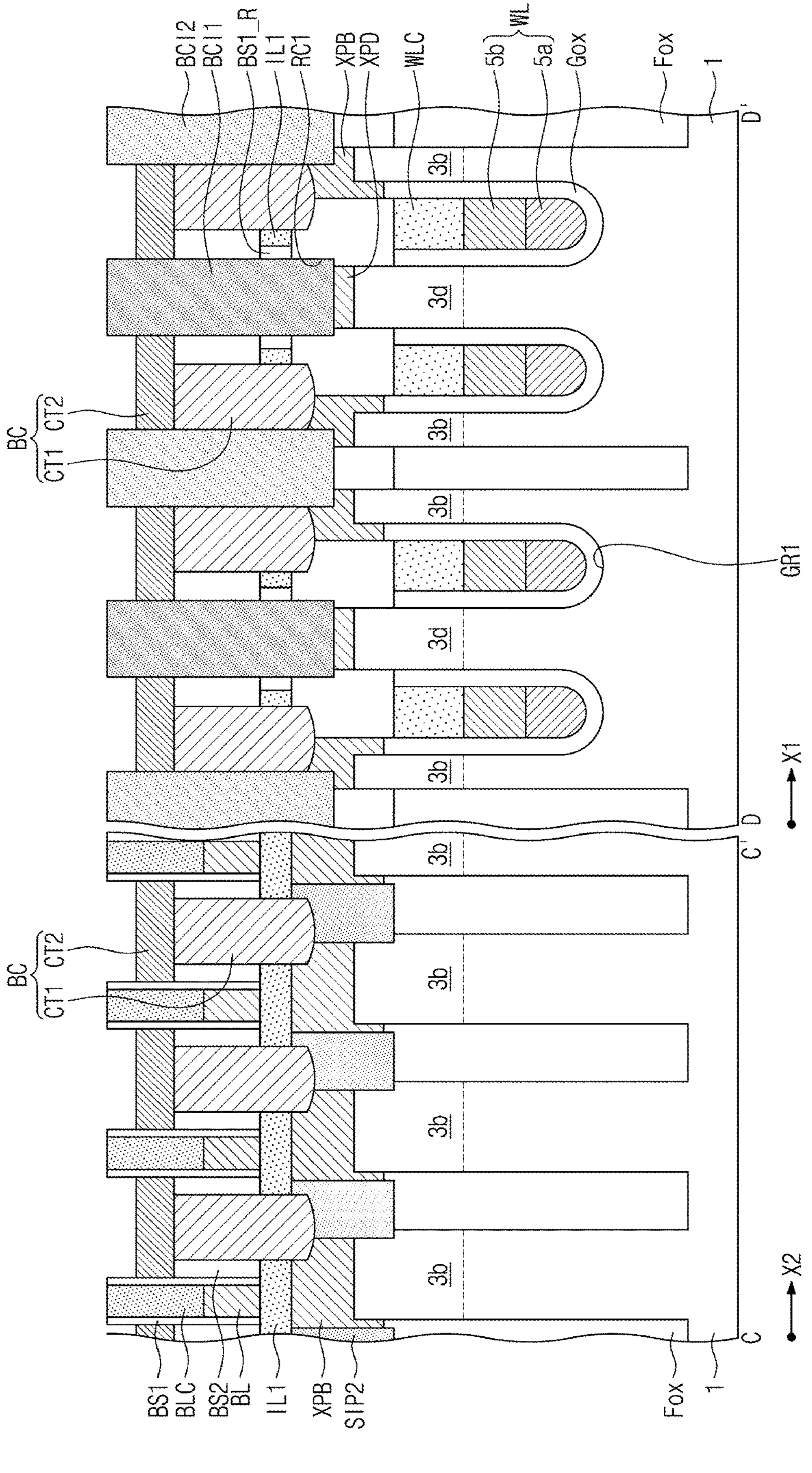

Referring to FIGS. 11A to 11C, upper portions of the first contacts CT1 may be removed to expose upper sidewalls of the second bit line spacer BS2. Upper portion of the second bit line spacer BS2 may be removed to expose an upper sidewall of the first bit line spacer BS1. A second contact layer may be deposited on the entire surface of the substrate 1 and etched back to form second contacts CT2 on the first contacts CT1. A cross section of FIG. 11A taken along line E-E' may be the same as or similar to that of FIG. 8D. Upper surfaces of the second contacts CT2 may be lower than upper surfaces of the first and second contact separation patterns BCI1 and BCI2 and side surfaces of the first and second contact separation patterns BCI1 and BCI2 may be exposed. The second contacts CT2 may be formed to cover the upper surfaces of the first contacts CT1 and the upper surface of the second bit line spacer BS2 and may be in contact with the upper side surface of the first bit line spacer BS1. Widths of the second contacts CT2 may be wider than those of the first contacts CT1. One first contact CT1 and the second contact CT2 thereon may constitute a storage node contact structure BC.

Subsequently, referring to FIGS. 12 and 1A to 1D, a landing pad layer may be deposited on the substrate 1 and anisotropically etched to form landing pads LP. The width of the second contacts CT2 may be wider than that of the first contacts CT1, thereby improving a misalignment margin between the second contacts CT2 and the landing pads LP. Accordingly, reliability of the semiconductor device may be improved. Due to the anisotropic etching, portions of the bit line capping pattern BLC, second contact separation pattern BCI2 and first contact separation pattern BCI1 may also be etched. A landing pad separation pattern LIP may be formed between the landing pads LP. Accordingly, the semiconductor device 100 of FIGS. 1A to 1D may be manufactured.

The method of manufacturing the semiconductor device according to the present disclosure may help secure a misalignment margin, thereby reducing process defects and improving yield.

Figure 13:
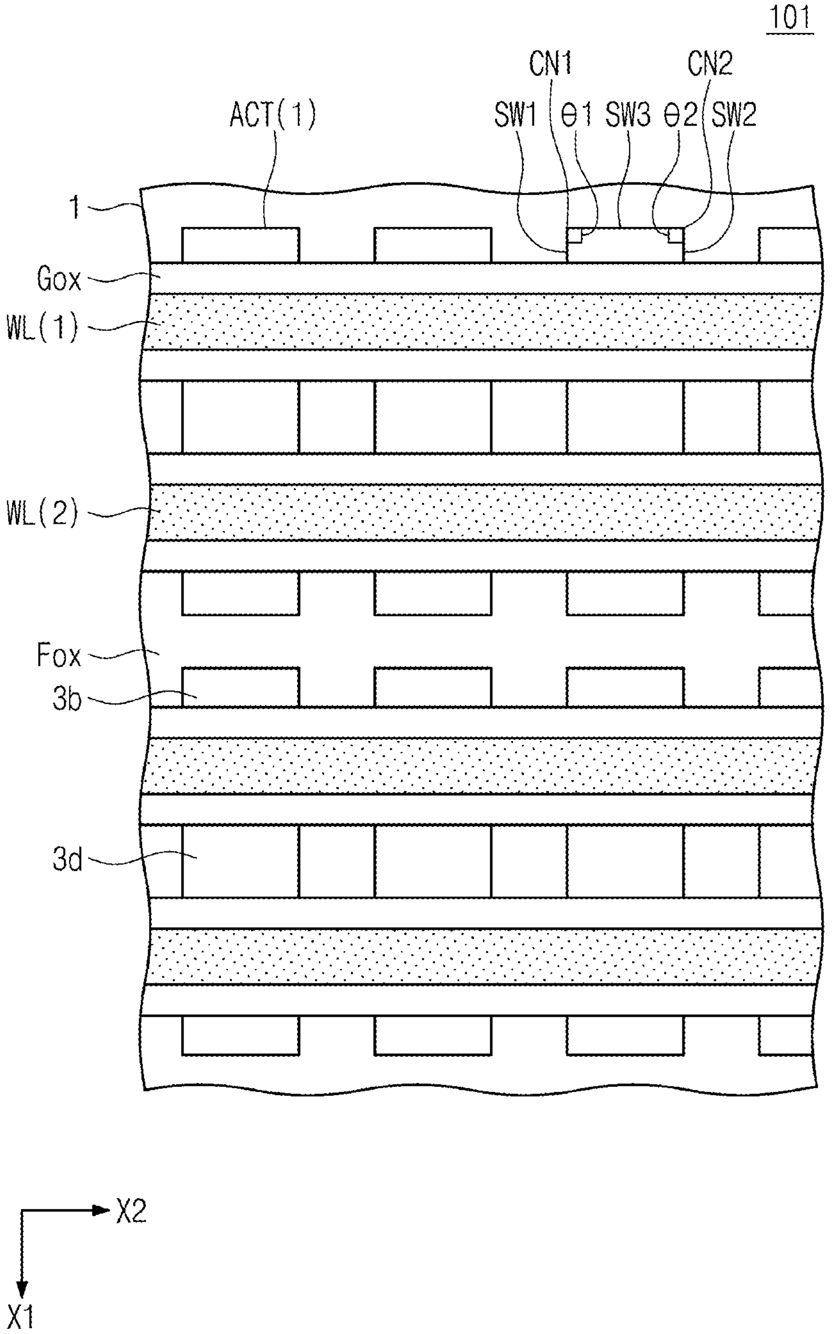
FIG. 13 is a plan view of a semiconductor device according to embodiments of the present disclosure.
Figure 14A:
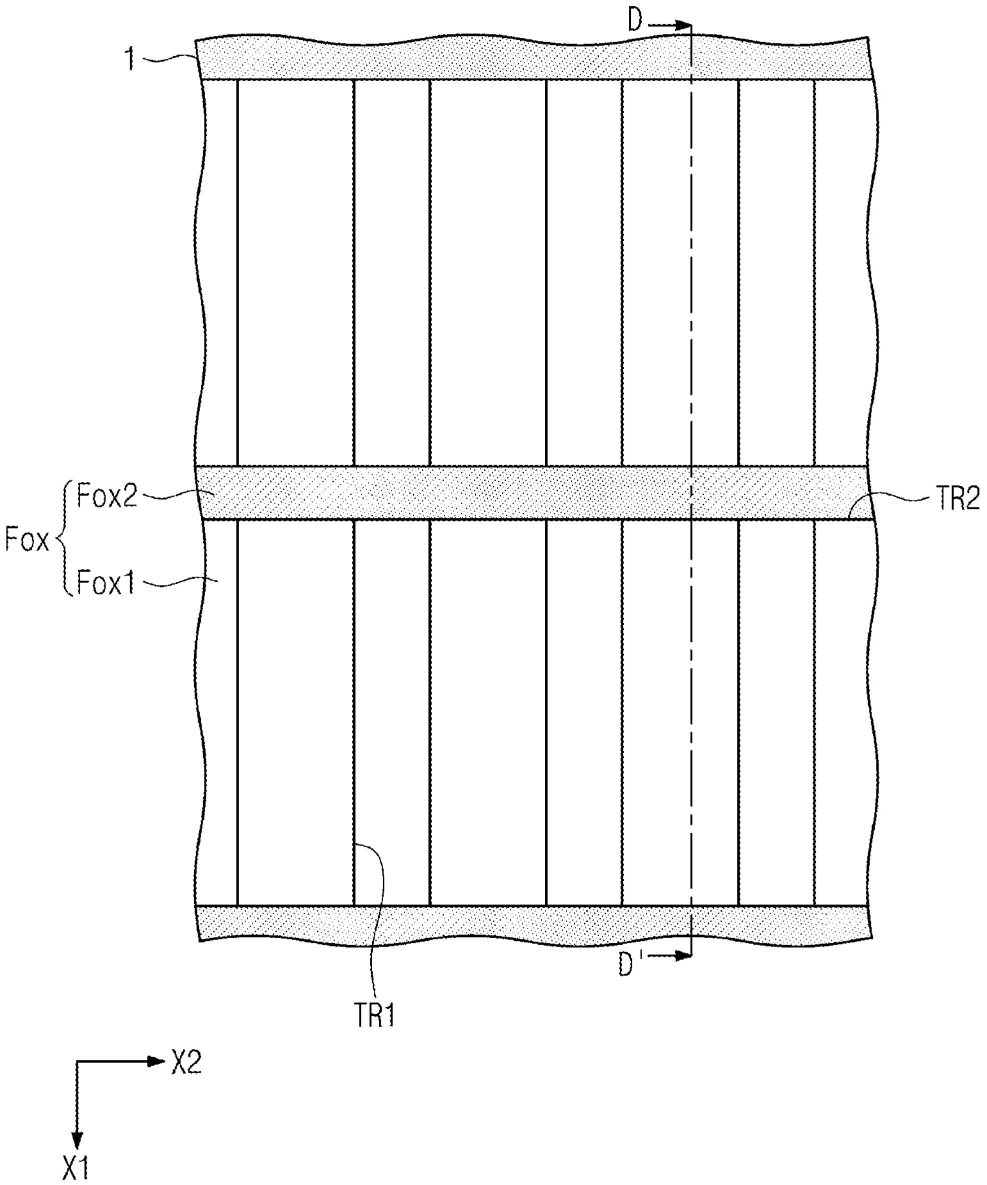
FIG. 14A is a plan view illustrating an arrangement of active regions of FIG. 13.
Figure 14B:
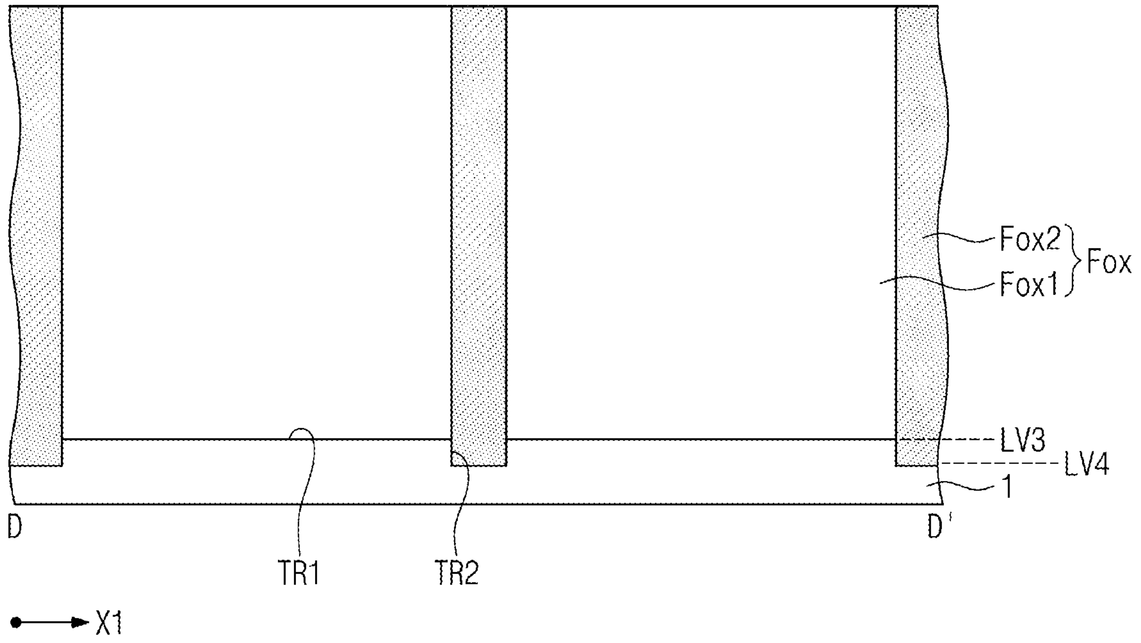
FIG. 14B is a cross-sectional view of FIG. 14A taken along line D-D'.

FIG. 13 is a plan view of a semiconductor device according to embodiments of the present disclosure. FIG. 14A is a plan view illustrating an arrangement of active regions of FIG. 13. FIG. 14B is a cross-sectional view of FIG. 14A taken along line D-D'.

Referring to FIGS. 13, 14A, and 14B, in a semiconductor device 101 according to the present embodiment, active regions ACT traversed by the word lines WL may have angled corners CN1 and CN2, respectively, when viewed in a plan view. In an implementation, the corners CN1 and CN2 of the active regions ACT where the second impurity region 3*b* is disposed may be angled rather than round as in FIG. 1A. In an implementation, referring to FIG. 13, each of the active regions ACT may have first and second sidewalls SW1 and SW2 that are parallel to each other and opposite to each other in the first direction X1. The active regions ACT may have a third sidewall SW3 connecting the first and second sidewalls SW1 and SW2. The first corner CN1 where the first sidewall SW1 and the third sidewall SW3 meet may have a first angle θ1. The second corner CN2 where the second sidewall SW2 and the third sidewall SW3 meet may have a second angle θ2. The first angle θ1 and the second angle θ2 may each independently be, e.g., 85° to 95°. In an implementation, the first angle θ1 and the second angle θ2 may each be right (90°) angles.

In the semiconductor device 101, the device isolation part Fox may have a dual structure of a first device isolation part Fox1 and a second device isolation part Fox2. The first device isolation part Fox1 may have a bar shape extending in the first direction X1. The second device isolation part Fox2 may have a line shape extending in the second direction X2. A level LV4 of a lower surface of the second device isolation part Fox2 may be lower than a level LV3 of a first device isolation part Fox1. Each of the first device isolation part Fox1 and the second device isolation part Fox2 may independently have a structure of a single layer or multiple layers including, e.g., silicon oxide, silicon nitride, or silicon oxynitride. Other structures may be the same as or similar to those described above.

To manufacture the semiconductor device 101 having the structure of the active regions ACT, referring to FIG. 14B, the substrate 1 may be etched to form first trenches TR1. The first trenches TR1 may be filled with an insulating layer to the first device isolation parts Fox1. The first device isolation parts Fox1 may be formed to have a line shape extending in the first direction X1. The first device isolation parts Fox1 and the substrate 1 may be etched to form second trenches TR2. The second trenches TR2 may be filled with an insulating layer to form the second device isolation parts Fox2. Other manufacturing processes may be the same as or similar to those described above.

Figure 15A:
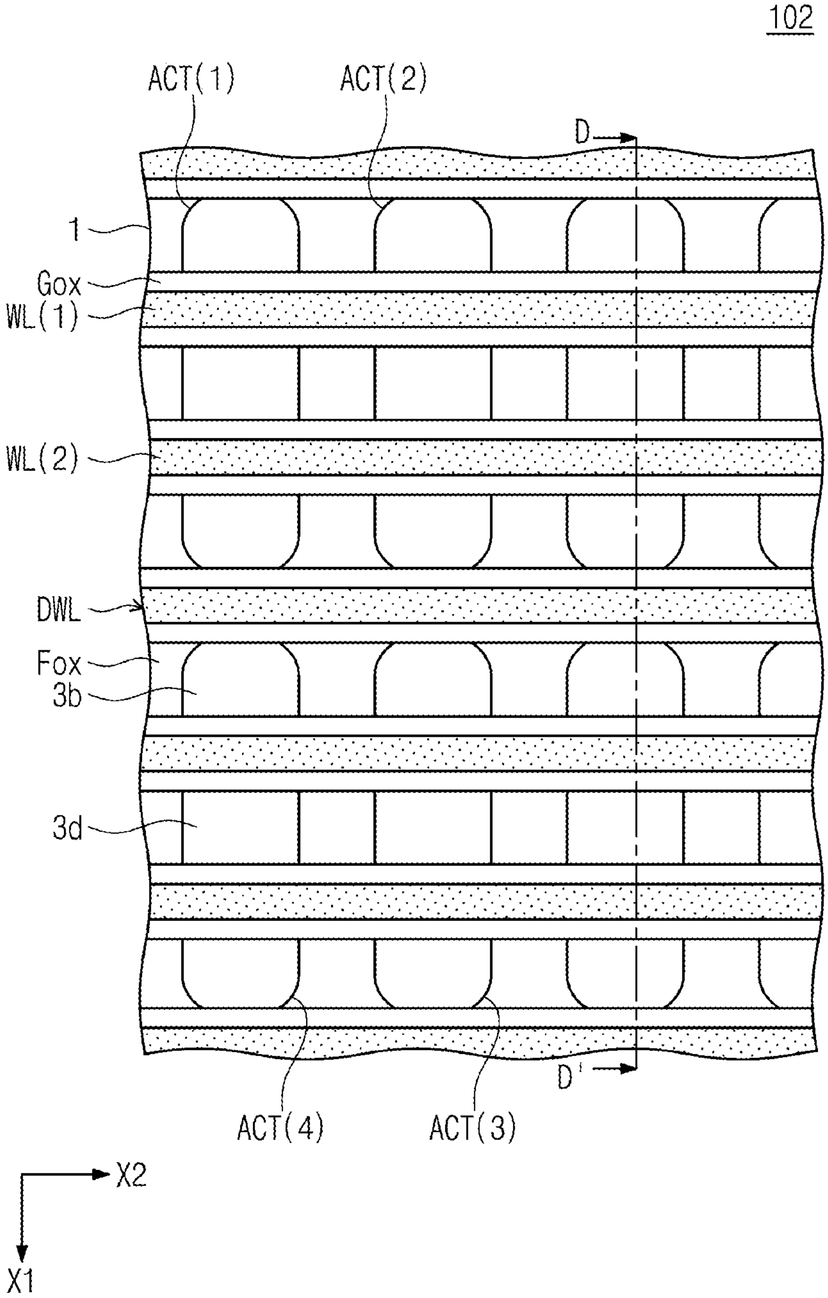
FIG. 15A is a plan view of a semiconductor device according to embodiments of the present disclosure.
Figure 15B:
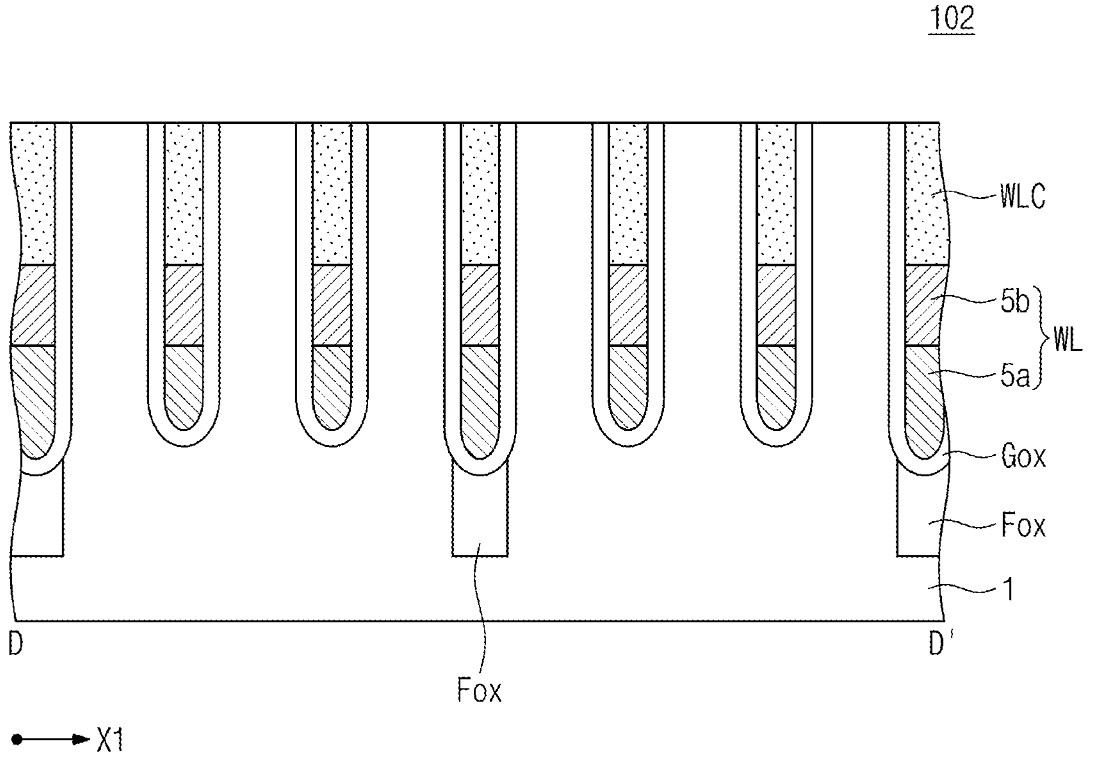
FIG. 15B is a cross-sectional view of FIG. 15A taken along line D-D'.

FIG. 15A is a plan view of a semiconductor device according to embodiments of the present disclosure. FIG. 15B is a cross-sectional view of FIG. 15A taken along line D-D'.

Referring to FIGS. 15A and 15B, in a semiconductor device 102 according to the present embodiment, a dummy word line DWL may extend in the second direction X2 and may be between the first and second active regions ACT(1) and ACT(2) and the third and fourth active regions ACT(3) and ACT(4). The dummy word line DWL may not actually operate. A ground voltage may be applied to the dummy word line DWL or may be electrically floated. A dummy word line DWL may be in the device isolation part Fox. The dummy word line DWL may include a first word line pattern 5*a* and a second word line pattern 5*b* sequentially stacked. A word line capping pattern WLC may be on the dummy word line DWL. A gate insulating layer Gox may be between the dummy word line DWL and the substrate 1. Other structures may be the same as or similar to those described above.

Figure 16:
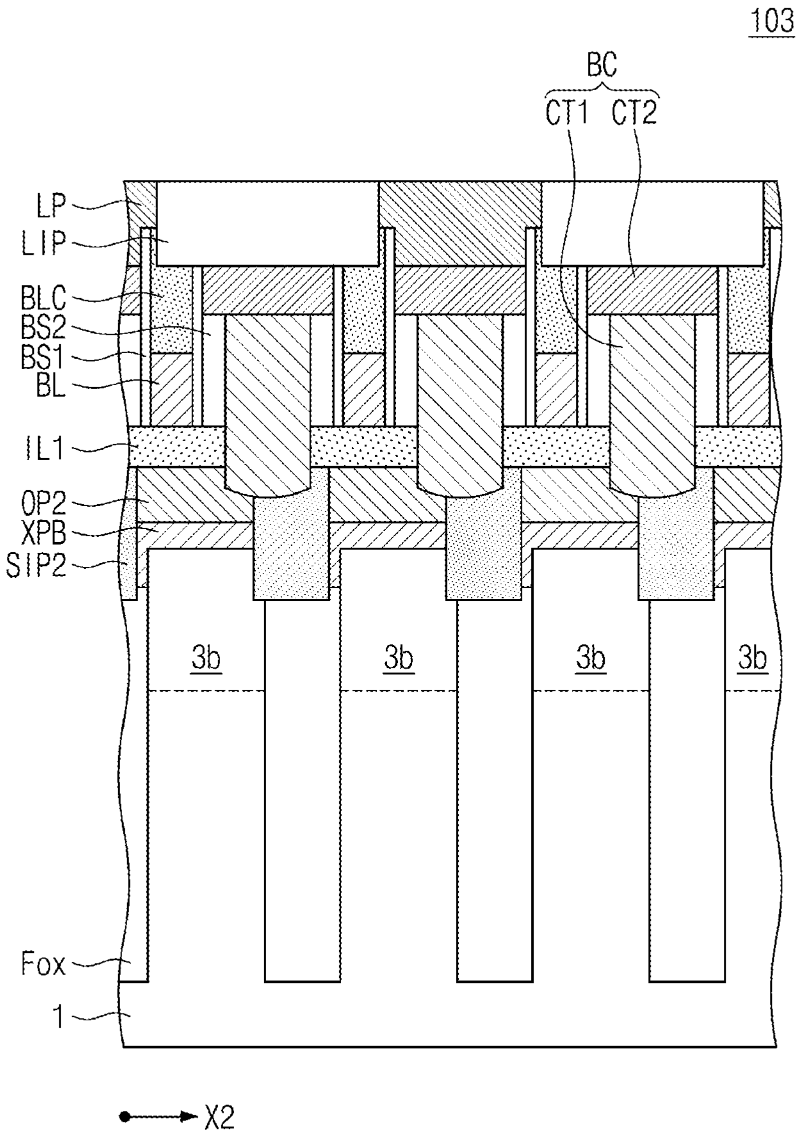
FIG. 16 is a cross-sectional view of FIG. 1A taken along line C-C' according to embodiments of the present disclosure.

FIG. 16 is a cross-sectional view of FIG. 1A taken along line C-C' according to embodiments of the present disclosure.

Referring to FIG. 16, a semiconductor device 103 according to the present embodiment may further include a second ohmic pattern OP2 on the second conductive pad XPB. The second ohmic pattern OP2 may include a metal silicide. The second ohmic pattern OP2 may be between the second conductive pad XPB and the first contact CT1. Side surfaces of the second ohmic pattern OP2 and second conductive pad XPB may be aligned with each other. Other structures may be the same as or similar to those described above.

In the semiconductor device 103 according to the present embodiment, after the steps of FIGS. 6A to 6D and before forming the first interlayer insulating layer IL1 of FIGS. 7A to 7D, the first and second conductive pads XPD and XPB may be silicided to simultaneously form the first and second ohmic patterns OP1 and OP2. In FIGS. 7A to 7D, the first ohmic patterns OP1 may not be additionally formed. Other manufacturing processes may be the same as or similar to those described above.

In an implementation, the semiconductor device 103 may include the second ohmic pattern OP2 but may exclude the first ohmic pattern OP1.

Figure 17:
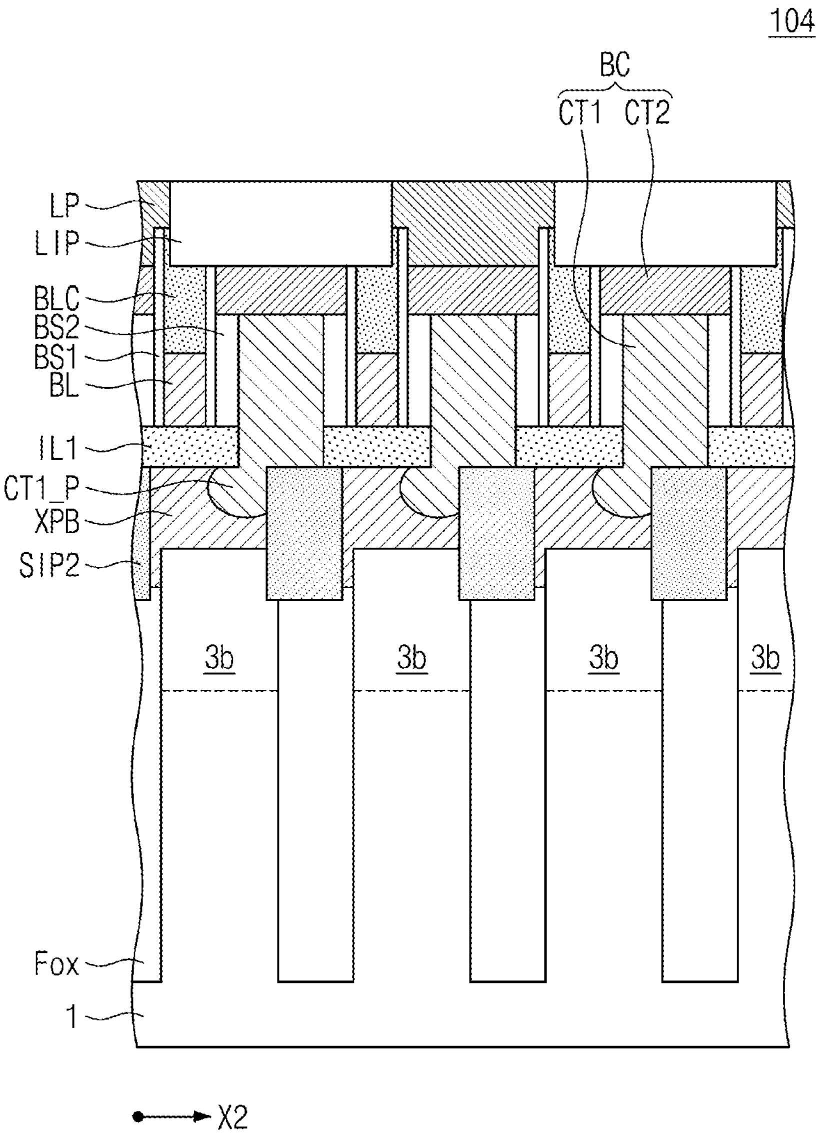
FIG. 17 is a cross-sectional view taken along line C-C' of FIG. 1A according to embodiments of the present disclosure.

FIG. 17 is a cross-sectional view taken along line C-C' of FIG. 1A according to embodiments of the present disclosure.

Referring to FIG. 17, in a semiconductor device 104 according to the present embodiment, an upper surface of the second pad separation pattern SIP2 may be flat. The first contact CT1 may be in contact with the flat upper surface and the vertical sidewall of the second pad separation pattern SIP2, simultaneously. A lower portion of the first contact CT1 may have a protruding portion CT1_P inserted into the second conductive pad XPB. An interface between the protrusion CT1_P and the second conductive pad XPB may be rounded. Other configurations may be the same as or similar to those described above.

By way of summation and review, new or more expensive exposure techniques may be used to form fine patterns of the semiconductor devices, and it could be difficult to highly integrate the semiconductor device. Thus, new integration techniques may be considered.

One or more embodiments may provide a semiconductor device with improved reliability.

The semiconductor device according to the present disclosure may have an array of the active regions with increased misalignment margin. In addition, the bit line contact and the conductive pads in contact with the storage node contact structures, respectively, may be provided, thereby improving the misalignment margin. Accordingly, the reliability of the semiconductor device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

a device isolation part on the substrate and defining active regions that are two-dimensionally disposed in a first direction and a second direction, the active regions each extending in the first direction in a plan view;

first and second word lines crossing the active regions in the second direction and adjacent to each other in the first direction;

a first impurity region in an active region between the first and second word lines;

a second impurity region in an active region at one side of the first word line and spaced apart from the first impurity region;

at least one first conductive pad in contact with the first impurity region;

at least one second conductive pad in contact with the second impurity region;

a bit line on the at least one first conductive pad and extending in the first direction to be parallel to the active regions in a plan view;

at least one storage node contact structure on the at least one second conductive pad; and a landing pad on the at least one storage node contact structure.

2. The semiconductor device as claimed in claim 1, wherein:

one of the active regions includes a first sidewall and a second sidewall that are opposite to each other and extend in the first direction, the bit line, the at least one first conductive pad, and the at least one second conductive pad overlap the first sidewall and are spaced apart from the second sidewall when viewed in a plan view, and the at least one storage node contact structure overlaps the second sidewall and is spaced apart from the first sidewall when viewed in a plan view.

3. The semiconductor device as claimed in claim 1, wherein:

the active regions includes a first active region, a second active region, a third active region, and a fourth active region which are arranged in a clockwise direction, and the device isolation part includes:

a first device isolation part between the first active region and the second active region of the active regions and extending in the first direction; and a second device isolation part between the first active region and the fourth active region of the active regions and between the second active region and the third active region of the active regions and extending in the second direction.

4. The semiconductor device as claimed in claim 3, further comprising a dummy word line in the second device isolation part, wherein the dummy word line is electrically grounded or floated.

5. The semiconductor device as claimed in claim 1, wherein the at least one storage node contact structure includes:

a first contact contacting the at least one second conductive pad and having a first width; and a second contact on the first contact and having a second width greater than the first width.

6. The semiconductor device as claimed in claim 5, wherein:

the at least one first conductive pad includes a plurality of first conductive pads, the at least one second conductive pad includes a plurality of second conductive pads, the semiconductor device further includes:

a first pad separation pattern between the plurality of first conductive pads and the plurality of second conductive pads in the first direction; and a second pad separation pattern between the plurality of second conductive pads in the second direction, and the first contact is in contact with both the first pad separation pattern and the second pad separation pattern.

7. The semiconductor device as claimed in claim 6, wherein:

an upper surface of the second pad separation pattern is flat, and the first contact includes a protruding portion covering upper and side surfaces of the second pad separation pattern and inserted into the plurality of second conductive pads.

8. The semiconductor device as claimed in claim 5, further comprising:

a first interlayer insulating pattern between the bit line and the at least one second conductive pad;

a bit line capping pattern on the bit line;

a first bit line spacer covering sidewalls of the bit line capping pattern and the bit line; and a second bit line spacer covering a lower sidewall of the first bit line spacer and exposing an upper sidewall of the first bit line spacer, wherein the first contact is spaced apart from the first bit line spacer, and wherein the second contact is in contact with both an upper end of the second bit line spacer and the first bit line spacer.

9. The semiconductor device as claimed in claim 8, wherein:

the at least one storage node contact structure includes first to third storage node contact structures spaced apart from each other in the second direction, the semiconductor device further includes:

a first contact separation pattern between the first and second storage node contact structures; and a second contact separation pattern between the second and third storage node contact structures, and the second bit line spacer is between the first contact separation pattern and the first storage node contact structure, and is in contact with the first contact separation pattern and the first storage node contact structure.

10. The semiconductor device as claimed in claim 1, further comprising a gate insulating layer between the first word line and the substrate, wherein the at least one second conductive pad overlaps the gate insulating layer, and wherein the storage node contact structure overlaps the first word line.

11. The semiconductor device as claimed in claim 1, wherein:

when viewed in a plan view, each of the active regions includes:

a first sidewall and a second sidewall that are opposite to each other, extend in the first direction, and are spaced apart from each other in the second direction; and a third sidewall connecting the first sidewall and the second sidewall, and the first sidewall and the third sidewall meet at a first corner, the second sidewall and the third sidewall meet at a second corner, and each of the first corner and the second corner has an angle of 85 to 95 degrees.

12. The semiconductor device as claimed in claim 1, wherein the at least one first conductive pad or the at least one second conductive pad includes:

a first silicon pattern in contact with the substrate; and a first ohmic pattern on the first silicon pattern.

13. The semiconductor device as claimed in claim 1, further comprising a bit line contact between the bit line and the at least one first conductive pad, wherein the bit line contact has a first width in the first direction, and wherein the at least one first conductive pad has a second width smaller than the first width in the first direction.

14. The semiconductor device as claimed in claim 1, wherein:

the device isolation part is lower than an upper surface of the substrate and exposes a side surface of the substrate, and the at least one first conductive pad and the at least one second conductive pad are each in contact with the side surface of the substrate.

15. The semiconductor device as claimed in claim 1, wherein a level of a lower end of the at least one first conductive pad is the same as a level of a lower end of the at least one second conductive pad.

16. The semiconductor device as claimed in claim 1, wherein:

the active regions include a first active region and a second active region adjacent to each other in the second direction, and a first distance between a first impurity region in the first active region and a second impurity region in the second active region is greater than a second distance between the first impurity region in the first active region and a first impurity region in the second active region.

17. A semiconductor device, comprising:

a substrate;

a device isolation part on the substrate and defining active regions that are two-dimensionally disposed in a first direction and a second direction, the active regions each extending in the first direction in a plan view;

first and second word lines crossing the active regions in the second direction and adjacent to each other in the first direction;

a first impurity region in an active region between the first and second word lines;

a second impurity region in an active region at one side of the first word line and spaced apart from the first impurity region;

at least one first conductive pad in contact with the first impurity region;

at least one second conductive pad in contact with the second impurity region;

a bit line on the at least one first conductive pad and extending in the first direction to be parallel to the active regions in a plan view; and a storage node contact structure on the at least one second conductive pad, wherein:

one of the active regions includes a first sidewall and a second sidewall that are opposite to each other, extend in the first direction, and are parallel to each other, the bit line, the at least one first conductive pad, and the at least one second conductive pad overlap the first sidewall and are spaced apart from the second sidewall, when viewed in a plan view, and the storage node contact structure overlaps the second sidewall and is spaced apart from the first sidewall when viewed in a plan view.

18. The semiconductor device as claimed in claim 17, wherein:

the storage node contact structure includes:

a first contact contacting the at least one second conductive pad and having a first width; and a second contact disposed on the first contact and having a second width greater than the first width, the at least one first conductive pad includes a plurality of first conductive pads, the at least one second conductive pad includes a plurality of second conductive pads, the semiconductor device further includes:

a first pad separation pattern between the plurality of first conductive pads and the plurality of second conductive pads in the first direction; and a second pad separation pattern between the plurality of second conductive pads in the second direction, an upper surface of the second pad separation pattern is flat, and the first contact includes a protruding portion covering upper and side surfaces of the second pad separation pattern and inserted into the plurality of second conductive pads.

19. A semiconductor device, comprising:

a substrate;

a device isolation part on the substrate and defining active regions that are two-dimensionally disposed in a first direction and a second direction, the active regions each extending in the first direction;

first and second word lines crossing the active regions in the second direction and adjacent to each other in the first direction;

a word line capping pattern on each of the first and second word lines and buried in the substrate;

a gate insulating layer between the first word line and the substrate;

a first impurity region in an active region between the first and second word lines;

a second impurity region in an active region at one side of the first word line and spaced apart from the first impurity region;

a first conductive pad in contact with the first impurity region;

a second conductive pad in contact with the second impurity region;

a bit line on the first conductive pad and extending in the first direction;

a storage node contact structure on the second conductive pad;

a landing pad on the storage node contact structure; and a first bit line spacer and a second bit line spacer sequentially between the bit line and the storage node contact structure, wherein the active regions include a first active region and a second active region adjacent to each other in the second direction, and wherein a first distance between a first impurity region in the first active region and a second impurity region in the second active region is greater than a second distance between the first impurity region in the first active region and a first impurity region in the second active region.

20. The semiconductor device as claimed in claim 19, wherein:

one of the active regions includes a first sidewall and a second sidewall that are opposite to each other, that extend in the first direction, and that are parallel to each other, the bit line, the first conductive pad, and the second conductive pad overlap the first sidewall and are spaced apart from the second sidewall when viewed in a plan view, and the storage node contact structure overlaps the second sidewall and is spaced apart from the first sidewall when viewed in a plan view.

* * * * *